US012635122B2

(12) United States Patent
Roy

(10) Patent No.: US 12,635,122 B2
(45) Date of Patent: May 19, 2026

(54) MULTI-CHIP MEMORY SYSTEM INCLUDING DRAM CHIPS WITH INTEGRATED COMPARATOR ARRAYS AND METHOD OF OPERATING SAME

(71) Applicant: Atomera Incorporated, Los Gatos, CA (US)

(72) Inventor: Richard Stephen Roy, Lago Vista, TX (US)

(73) Assignee: Atomera Incorporated, Los Gatos, CA (US)

( * ) Notice: Subject to any disclaimer, the term of this patent is extended or adjusted under 35 U.S.C. 154(b) by 388 days.

(21) Appl. No.: 18/509,056

(22) Filed: Nov. 14, 2023

(65) Prior Publication Data

US 2024/0164082 A1 May 16, 2024

Related U.S. Application Data

(60) Provisional application No. 63/383,961, filed on Nov. 16, 2022.

(51) Int. Cl.
*H10B 12/00* (2023.01)
*G11C 11/4096* (2006.01)
(Continued)

(52) U.S. Cl.
CPC ........ *H10B 12/033* (2023.02); *G11C 11/4096* (2013.01); *H10B 12/50* (2023.02); *H10B 80/00* (2023.02); *H10W 90/00* (2026.01)

(58) Field of Classification Search
CPC ...... H10B 12/033; H10B 12/50; H10B 80/00; G11C 11/4096; H01L 25/0657
See application file for complete search history.

(56) References Cited

U.S. PATENT DOCUMENTS

| | | | |
|---|---|---|---|
| 4,937,204 A | 6/1990 | Ishibashi et al. | |
| 5,216,262 A | 6/1993 | Tsu | |

(Continued)

FOREIGN PATENT DOCUMENTS

| | | | |
|---|---|---|---|
| GB | 2347520 A | 9/2000 | |
| TW | I405212 B | 8/2013 | |

(Continued)

OTHER PUBLICATIONS

Emilio, Maurizio Di Paolo, "Quantum-Engineered Material Boosts Transistor Performance" https://www.eetimes.com/quantum-engineered-material-boosts-transistor-performance/# EE Times; retrieved from Internet Feb. 10, 2022, 3 pages.

(Continued)

*Primary Examiner* — SM Sohel Imtiaz
(74) *Attorney, Agent, or Firm* — Bever, Hoffman & Harms, LLP

(57) ABSTRACT

A memory system including a first chip having a processor, and a second chip having a DRAM sector that includes: a plurality of DRAM arrays; an output circuit configured to store a plurality of data values read from the DRAM arrays; a first set of through silicon vias (TSVs) connecting the processor to the DRAM sector, wherein the first processor transmits a plurality of weight data values to the DRAM sector on the first set of TSVs; a plurality of comparator arrays coupled to receive the plurality of weight data values and the plurality of data values read from the DRAM arrays, and in response, generate a plurality of comparison output values; and a second set of TSVs connecting the processor to the DRAM sector, wherein the plurality of comparison output values are transmitted from DRAM sector to the processor on the second set of TSVs.

20 Claims, 14 Drawing Sheets

(51) Int. Cl.
  H10B 80/00     (2023.01)
  H10W 90/00    (2026.01)

(56)               References Cited

U.S. PATENT DOCUMENTS

| | | | |
|---|---|---|---|
| 5,357,119 | A | 10/1994 | Wang et al. |
| 5,438,543 | A | 8/1995 | Yoon |
| 5,683,934 | A | 11/1997 | Candelaria |
| 5,712,825 | A | 1/1998 | Hadderman et al. |
| 5,796,119 | A | 8/1998 | Seabaugh |
| 5,822,264 | A | 10/1998 | Tomishima et al. |
| 6,058,061 | A | 5/2000 | Ooishi |
| 6,111,803 | A | 8/2000 | Derner et al. |
| 6,226,754 | B1 | 5/2001 | Ware et al. |
| 6,376,337 | B1 | 4/2002 | Wang et al. |
| 6,447,933 | B1 | 9/2002 | Wang et al. |
| 6,472,685 | B2 | 10/2002 | Takagi |
| 6,636,454 | B2 | 10/2003 | Fujino et al. |
| 6,741,624 | B2 | 5/2004 | Mears et al. |
| 6,830,964 | B1 | 12/2004 | Mears et al. |
| 6,833,294 | B1 | 12/2004 | Mears et al. |
| 6,878,576 | B1 | 4/2005 | Mears et al. |
| 6,891,188 | B2 | 5/2005 | Mears et al. |
| 6,897,472 | B2 | 5/2005 | Mears et al. |
| 6,927,413 | B2 | 8/2005 | Mears et al. |
| 6,952,018 | B2 | 10/2005 | Mears et al. |
| 6,958,486 | B2 | 10/2005 | Mears et al. |
| 6,993,222 | B2 | 1/2006 | Mears et al. |
| 7,018,900 | B2 | 3/2006 | Kreps |
| 7,033,437 | B2 | 4/2006 | Mears et al. |
| 7,034,329 | B2 | 4/2006 | Mears et al. |
| 7,045,377 | B2 | 5/2006 | Mears et al. |
| 7,045,813 | B2 | 5/2006 | Mears et al. |
| 7,071,119 | B2 | 7/2006 | Mears et al. |
| 7,105,895 | B2 | 9/2006 | Wang et al. |
| 7,109,052 | B2 | 9/2006 | Mears et al. |
| 7,123,792 | B1 | 10/2006 | Mears et al. |
| 7,148,712 | B1 | 12/2006 | Prey, Jr. et al. |
| 7,153,763 | B2 | 12/2006 | Hytha et al. |
| 7,202,494 | B2 | 4/2007 | Blanchard et al. |
| 7,227,174 | B2 | 6/2007 | Mears et al. |
| 7,229,902 | B2 | 6/2007 | Mears et al. |
| 7,265,002 | B2 | 9/2007 | Mears et al. |
| 7,279,699 | B2 | 10/2007 | Mears et al. |
| 7,279,701 | B2 | 10/2007 | Kreps |
| 7,288,457 | B2 | 10/2007 | Kreps |
| 7,303,948 | B2 | 12/2007 | Mears et al. |
| 7,402,512 | B2 | 7/2008 | Derraa et al. |
| 7,432,524 | B2 | 10/2008 | Mears et al. |
| 7,435,988 | B2 | 10/2008 | Mears et al. |
| 7,436,026 | B2 | 10/2008 | Kreps |
| 7,446,002 | B2 | 11/2008 | Mears et al. |
| 7,446,334 | B2 | 11/2008 | Mears et al. |
| 7,491,587 | B2 | 2/2009 | Rao |
| 7,514,328 | B2 | 4/2009 | Rao |
| 7,517,702 | B2 | 4/2009 | Halilov et al. |
| 7,531,828 | B2 | 5/2009 | Mears et al. |
| 7,531,829 | B2 | 5/2009 | Blanchard |
| 7,531,850 | B2 | 5/2009 | Blanchard |
| 7,570,531 | B2 | 8/2009 | Nakamura et al. |
| 7,586,116 | B2 | 9/2009 | Kreps et al. |
| 7,586,165 | B2 | 9/2009 | Blanchard |
| 7,598,515 | B2 | 10/2009 | Mears et al. |
| 7,612,366 | B2 | 11/2009 | Mears et al. |
| 7,625,767 | B2 | 12/2009 | Huang et al. |
| 7,659,539 | B2 | 2/2010 | Kreps et al. |
| 7,700,447 | B2 | 4/2010 | Dukovski et al. |
| 7,718,996 | B2 | 5/2010 | Dukovski et al. |
| 7,781,827 | B2 | 8/2010 | Rao |
| 7,812,339 | B2 | 10/2010 | Mears et al. |
| 7,848,166 | B2 | 12/2010 | Hsu et al. |
| 7,863,066 | B2 | 1/2011 | Mears et al. |
| 7,880,161 | B2 | 2/2011 | Mears et al. |
| 7,928,425 | B2 | 4/2011 | Rao |
| 7,929,367 | B2 | 4/2011 | Yoo et al. |
| 8,164,941 | B2 | 4/2012 | Kang et al. |
| 8,389,974 | B2 | 3/2013 | Mears et al. |
| 8,605,532 | B2 | 12/2013 | Kajigaya et al. |
| 9,275,996 | B2 | 3/2016 | Mears et al. |
| 9,406,753 | B2 | 8/2016 | Mears et al. |
| 9,558,939 | B1 | 1/2017 | Stephenson et al. |
| 9,716,147 | B2 | 7/2017 | Mears |
| 9,721,790 | B2 | 8/2017 | Mears et al. |
| 9,722,046 | B2 | 8/2017 | Mears et al. |
| 9,899,479 | B2 | 2/2018 | Mears et al. |
| 9,941,359 | B2 | 4/2018 | Mears et al. |
| 9,972,685 | B2 | 5/2018 | Mears et al. |
| 10,084,045 | B2 | 9/2018 | Mears et al. |
| 10,107,854 | B2 | 10/2018 | Roy |
| 10,109,342 | B2 | 10/2018 | Roy |
| 10,109,479 | B1 | 10/2018 | Mears et al. |
| 10,170,560 | B2 | 1/2019 | Mears |
| 10,170,603 | B2 | 1/2019 | Mears et al. |
| 10,170,604 | B2 | 1/2019 | Mears et al. |
| 10,191,105 | B2 | 1/2019 | Roy |
| 10,249,745 | B2 | 4/2019 | Mears et al. |
| 10,276,625 | B1 | 4/2019 | Mears et al. |
| 10,304,881 | B1 | 5/2019 | Chen et al. |
| 10,355,151 | B2 | 7/2019 | Chen et al. |
| 10,361,243 | B2 | 7/2019 | Mears et al. |
| 10,367,028 | B2 | 7/2019 | Chen et al. |
| 10,367,064 | B2 | 7/2019 | Rao |
| 10,381,242 | B2 | 8/2019 | Takeuchi |
| 10,396,223 | B2 | 8/2019 | Chen et al. |
| 10,410,880 | B2 | 9/2019 | Takeuchi |
| 10,453,945 | B2 | 10/2019 | Mears et al. |
| 10,461,118 | B2 | 10/2019 | Chen et al. |
| 10,468,245 | B2 | 11/2019 | Weeks et al. |
| 10,529,757 | B2 | 1/2020 | Chen et al. |
| 10,529,768 | B2 | 1/2020 | Chen et al. |
| 10,566,191 | B1 | 2/2020 | Weeks et al. |
| 10,580,866 | B1 | 3/2020 | Takeuchi et al. |
| 10,580,867 | B1 | 3/2020 | Takeuchi et al. |
| 10,593,761 | B1 | 3/2020 | Takeuchi et al. |
| 10,608,027 | B2 | 3/2020 | Chen et al. |
| 10,608,043 | B2 | 3/2020 | Chen et al. |
| 10,615,209 | B2 | 4/2020 | Chen et al. |
| 10,622,057 | B2 | 4/2020 | Kawamura et al. |
| 10,636,879 | B2 | 4/2020 | Rao |
| 10,727,049 | B2 | 7/2020 | Weeks et al. |
| 10,741,436 | B2 | 8/2020 | Stephenson et al. |
| 10,763,370 | B2 | 9/2020 | Stephenson |
| 10,777,451 | B2 | 9/2020 | Stephenson et al. |
| 10,811,498 | B2 | 10/2020 | Weeks et al. |
| 10,818,755 | B2 | 10/2020 | Takeuchi et al. |
| 10,825,901 | B1 | 11/2020 | Burton et al. |
| 10,825,902 | B1 | 11/2020 | Burton et al. |
| 10,840,335 | B2 | 11/2020 | Takeuchi et al. |
| 10,840,336 | B2 | 11/2020 | Connelly et al. |
| 10,840,337 | B2 | 11/2020 | Takeuchi et al. |
| 10,840,388 | B1 | 11/2020 | Burton et al. |
| 10,847,618 | B2 | 11/2020 | Takeuchi et al. |
| 10,854,717 | B2 | 12/2020 | Takeuchi et al. |
| 10,868,120 | B1 | 12/2020 | Burton et al. |
| 10,879,356 | B2 | 12/2020 | Stephenson et al. |
| 10,879,357 | B1 | 12/2020 | Burton et al. |
| 10,884,185 | B2 | 1/2021 | Stephenson |
| 10,937,868 | B2 | 3/2021 | Burton et al. |
| 10,937,888 | B2 | 3/2021 | Burton et al. |
| 11,075,078 | B1 | 7/2021 | Cody et al. |
| 11,094,355 | B1 | 8/2021 | Simon et al. |
| 11,094,818 | B2 | 8/2021 | Takeuchi et al. |
| 11,177,351 | B2 | 11/2021 | Weeks et al. |
| 11,183,565 | B2 | 11/2021 | Burton et al. |
| 11,302,823 | B2 | 4/2022 | Weeks et al. |
| 11,329,154 | B2 | 5/2022 | Takeuchi et al. |
| 11,355,667 | B2 | 6/2022 | Stephenson |
| 11,469,302 | B2 | 10/2022 | Takeuchi et al. |
| 2003/0034529 | A1 | 2/2003 | Fitzgerald et al. |
| 2003/0057416 | A1 | 3/2003 | Currie et al. |
| 2004/0262594 | A1 | 12/2004 | Mears et al. |
| 2004/0266116 | A1 | 12/2004 | Mears et al. |
| 2005/0029510 | A1 | 2/2005 | Mears et al. |
| 2005/0032241 | A1 | 2/2005 | Coassin et al. |

(56) References Cited

U.S. PATENT DOCUMENTS

| | | | |
|---|---|---|---|
| 2005/0279991 A1 | 12/2005 | Mears et al. | |
| 2005/0282330 A1 | 12/2005 | Mears et al. | |
| 2006/0011905 A1 | 1/2006 | Mears et al. | |
| 2006/0220118 A1 | 10/2006 | Stephenson et al. | |
| 2006/0223215 A1 | 10/2006 | Blanchard | |
| 2006/0231857 A1 | 10/2006 | Blanchard | |
| 2006/0243963 A1* | 11/2006 | Kreps | H10D 62/8164 |
| | | | 257/E29.302 |
| 2006/0243964 A1 | 11/2006 | Kreps et al. | |
| 2006/0263980 A1 | 11/2006 | Kreps et al. | |
| 2006/0267130 A1 | 11/2006 | Rao | |
| 2006/0273299 A1 | 12/2006 | Stephenson et al. | |
| 2006/0289049 A1 | 12/2006 | Rao | |
| 2006/0292765 A1 | 12/2006 | Blanchard et al. | |
| 2007/0010040 A1 | 1/2007 | Mears et al. | |
| 2007/0012910 A1 | 1/2007 | Mears et al. | |
| 2007/0015344 A1 | 1/2007 | Mears et al. | |
| 2007/0020833 A1 | 1/2007 | Mears et al. | |
| 2007/0020860 A1 | 1/2007 | Mears et al. | |
| 2007/0063185 A1 | 3/2007 | Rao | |
| 2007/0063186 A1 | 3/2007 | Rao | |
| 2007/0158640 A1 | 7/2007 | Halilov et al. | |
| 2007/0166928 A1 | 7/2007 | Halilov et al. | |
| 2007/0187667 A1 | 8/2007 | Halilov et al. | |
| 2008/0012004 A1 | 1/2008 | Huang et al. | |
| 2010/0270535 A1 | 10/2010 | Halilov et al. | |
| 2011/0063891 A1 | 3/2011 | Kajigaya | |
| 2011/0184688 A1 | 7/2011 | Uetake et al. | |
| 2011/0215299 A1 | 9/2011 | Rao | |
| 2011/0248697 A1 | 10/2011 | Kajigaya et al. | |
| 2013/0028039 A1* | 1/2013 | Wang | G11C 11/4072 |
| | | | 365/226 |
| 2013/0094272 A1 | 4/2013 | Riho | |
| 2013/0240744 A1 | 9/2013 | Hurst, Jr. et al. | |
| 2014/0169069 A1 | 6/2014 | Oh | |
| 2017/0148498 A1 | 5/2017 | Nishioka et al. | |
| 2017/0301679 A1 | 10/2017 | Masuoka et al. | |
| 2017/0330609 A1* | 11/2017 | Roy | H10D 84/038 |
| 2018/0090501 A1* | 3/2018 | Yamakoshi | G11C 11/4096 |
| 2019/0027230 A1 | 1/2019 | Ryu et al. | |
| 2019/0043869 A1 | 2/2019 | Masuoka et al. | |
| 2019/0115066 A1* | 4/2019 | Ramaraju | G11C 7/08 |
| 2019/0157166 A1 | 5/2019 | Masuoka et al. | |
| 2019/0370645 A1 | 12/2019 | Lee et al. | |
| 2020/0143870 A1 | 5/2020 | Zhao et al. | |

| | | | |
|---|---|---|---|
| 2020/0258897 A1 | 8/2020 | Yan et al. | |
| 2020/0294577 A1* | 9/2020 | Ellis | G11C 11/4072 |
| 2020/0321047 A1 | 10/2020 | Best et al. | |
| 2020/0326865 A1 | 10/2020 | Kim et al. | |
| 2022/0285367 A1 | 9/2022 | Fackenthal | |
| 2022/0392519 A1* | 12/2022 | Osborne | H01L 25/18 |
| 2023/0124767 A1* | 4/2023 | Bhatia | G11C 7/1096 |
| | | | 365/189.011 |
| 2023/0360692 A1* | 11/2023 | Tu | G11C 11/419 |

FOREIGN PATENT DOCUMENTS

| | | |
|---|---|---|
| TW | I585774 B | 6/2017 |
| WO | 2015153255 A1 | 10/2015 |

OTHER PUBLICATIONS

Luo et al., "Chemical Design of Direct-Gap Light-Emitting Silicon" published in Physical Review Letters, vol. 89, No. 7; Aug. 12, 2002, 4 pages.

Mears et al., "Simultaneous Carrier Transport Enhancement and variability reduction in Si MOSFETs by insertion of partial Monolayers of oxygen" IEEE Silicon Nanoelectronics Workshop (2012); Conference Date Jun. 10-11, 2012, 2 pages.

Novikov et al. "Silicon-based Optoelectronics" 1999-2003, pp. 1-6.

Tsu, R. "Si Based Green ELD: Si-Oxygen Superlattice" ysiwyg://I/http://www3.interscience,wiley.com/cgi-bin/abstract/72512946/start: published online Jul. 21, 2000; 2 pages, Abstract Only.

Tsu, R. "Phenomena in silicon nanostructure device" published online Sep. 6, 2000 by Applied Physics and Materials Science Processing, pp. 391-402.

Xu et al. "Effectiveness of Quasi-Confinement Technology for Improving P-channel Si and Ge MOSFET Performance" Department of Electrical Engineering and Computer Science, University of California, Berkeley, 2012, 2 pages, mearstech.net; retrieved from Internet Jan. 18, 201.

Xu et al., "Extension of planar bulk n-channel MOSFET scaling with oxygen insertion technology" IEEE Transactions on Electron Devices, vol. 61, No. 9; Sep. 2014, pp. 3345-3349.

Xu et al., "MOSFET performance and scalability enhancement by insertion of oxygen layers", Department of Electrical Engineering and Computer Science, University of California, Berkeley, 2012, pp. 1-4.

* cited by examiner

MULTI-CHIP MEMORY SYSTEM INCLUDING DRAM CHIPS WITH INTEGRATED COMPARATOR ARRAYS AND METHOD OF OPERATING SAME

PRIORITY APPLICATION

This application claims priority to U.S. Provisional Patent Application 63/383,961 entitled "DRAM Architecture With On-Chip Comparators And Related Methods", filed by Richard Stephen Roy on Nov. 16, 2022.

TECHNICAL FIELD

The present disclosure generally relates to semiconductor devices, and, more particularly, to semiconductor memory devices configured to perform comparison operations.

BACKGROUND

Machine learning and artificial intelligence (AI) rely on the ability to quickly perform a large number of comparison operations. For example, a facial recognition application may be implemented by comparing streaming video image data with known facial image data. It is therefore desirable to have circuits and methods for quickly and efficiently performing a large number of comparison operations.

Dynamic random access memory (DRAM) is typically used to store data values used in comparison operations. An important requirement for DRAM (Dynamic Random Access Memory) devices is the ability to hold data in an inactive state with minimum power drain. This power drain comes from the need to refresh the data stored in bit cells in selected portions of the memory, as well as leakage in the rest of the periphery. This specification is referred to as IDD6. This directly affects the usable time from a battery charge for smart phones, laptops, etc. Another important parameter for DRAM devices is latency. Latency is the delay between selecting a random location within the memory device and the arrival of the selected data on the outputs.

One particularly advantageous memory device is set forth in U.S. Pat. No. 7,659,539 to Kreps et al., which is assigned to the present Assignee and hereby incorporated herein in its entirety by reference. This patent discloses a semiconductor device which includes a semiconductor substrate and at least one non-volatile memory cell. The at least one non-volatile memory cell may include spaced apart source and drain regions, and a superlattice channel including a plurality of stacked groups of layers on the semiconductor substrate between the source and drain regions. Each group of layers of the superlattice channel may include a plurality of stacked base semiconductor monolayers defining a base semiconductor portion and an energy band-modifying layer thereon, which may include at least one non-semiconductor monolayer constrained within a crystal lattice of adjacent base semiconductor portions. A floating gate may be adjacent the superlattice channel, and a control gate may be adjacent the second gate insulating layer.

An advantageous DRAM architecture is disclosed in U.S. Pat. No. 10,109,342 to Roy. This includes a plurality of memory cells, and at least one peripheral circuit coupled to the plurality of memory cells and comprising a superlattice. The superlattice includes a plurality of stacked groups of layers with each group of layers comprising a plurality of stacked base semiconductor monolayers defining a base semiconductor portion and at least one non-semiconductor monolayer thereon constrained within a crystal lattice of adjacent base semiconductor portions. The semiconductor device further includes a first power switching device configured to couple the at least one peripheral circuit to a first voltage supply during a first operating mode, and a second power switching device configured to couple the at least one peripheral circuit to a second voltage supply lower than the first voltage supply during a second operating mode.

The above-described DRAM devices that incorporate superlattice channels can be used to provide comparison data values in a power efficient manner. Despite the advantages provided by such DRAM devices, further developments in the structure and operating methods of memory systems are desirable to optimize the operation of applications that require large numbers of comparison operations.

DETAILED DESCRIPTION

Figure 1:
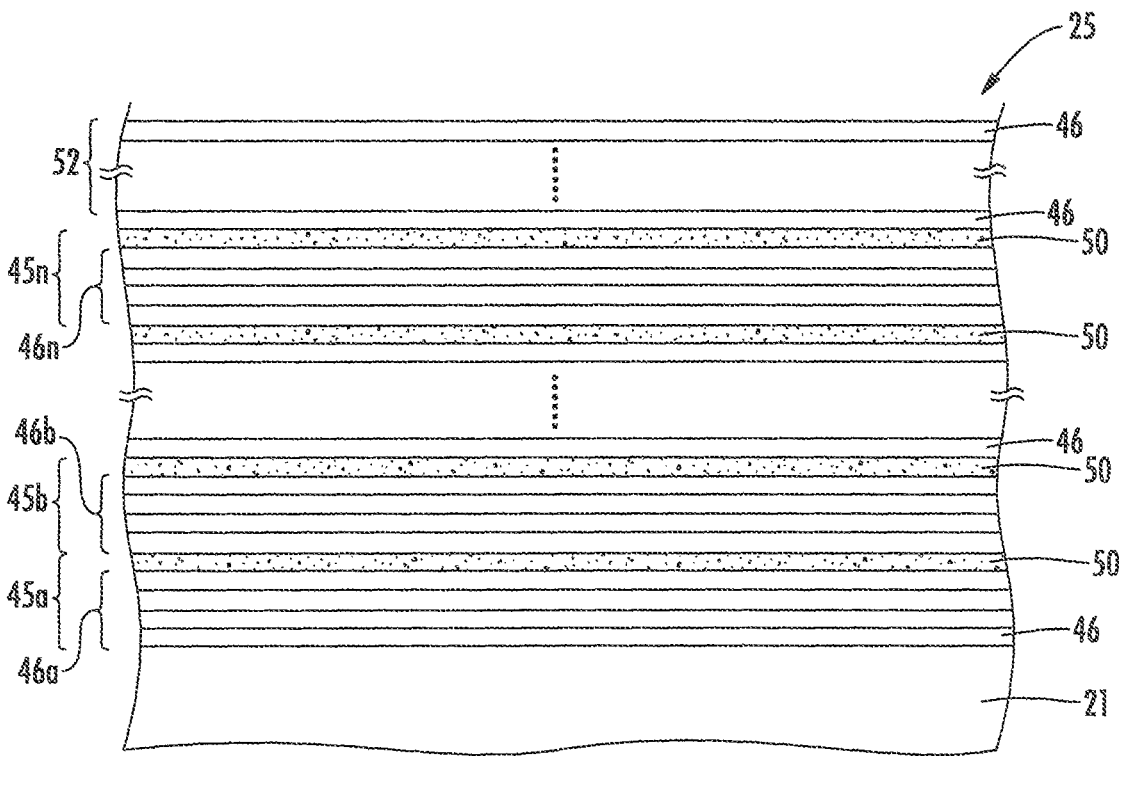
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to the formation of semiconductor devices utilizing an enhanced semiconductor superlattice. The enhanced semiconductor superlattice may also be referred to as an "MST" layer/film or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $$M_e^{-1}$$

and $$M_h^{-1}$$

for electrons and holes respectively, defined as:

$$M_{e,ij}^{-1}(E_F, T) = \frac{\sum_{E>E_F} \int_{B.Z.} (\nabla_k E(k, n))_i (\nabla_k E(k, n))_j \frac{\partial f(E(k, n), E_F, T)}{\partial E} d^3k}{\sum_{E>E_F} \int_{B.Z.} f(E(k, n), E_F, T) d^3k}$$

for electrons and:

$$M_{h,ij}^{-1}(E_F, T) = \frac{-\sum_{E<E_F} \int_{B.Z.} (\nabla_k E(k, n))_i (\nabla_k E(k, n))_j \frac{\partial f(E(k, n), E_F, T)}{\partial E} d^3k}{\sum_{E<E_F} \int_{B.Z.} (1 - f(E(k, n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again, Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
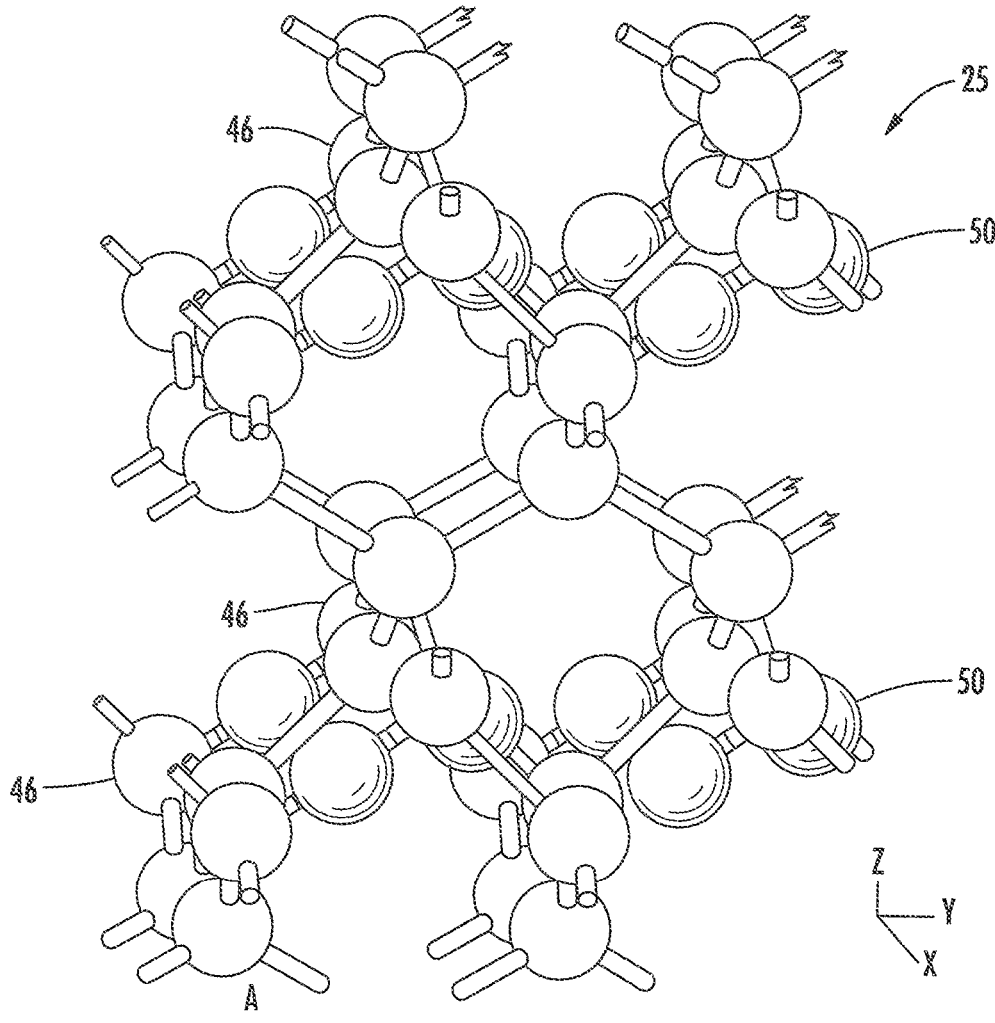
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45$n$. The cap layer 52 may comprise a plurality of base semiconductor monolayers 46. By way of example, the cap layer 52 may have between 1 to 100 monolayers 46 of the base semiconductor, and, more preferably between 10 to 50 monolayers. However, in some applications the cap layer 52 may be omitted, or thicknesses greater than 100 monolayers may be used.

Each base semiconductor portion 46*a*-46*n* may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
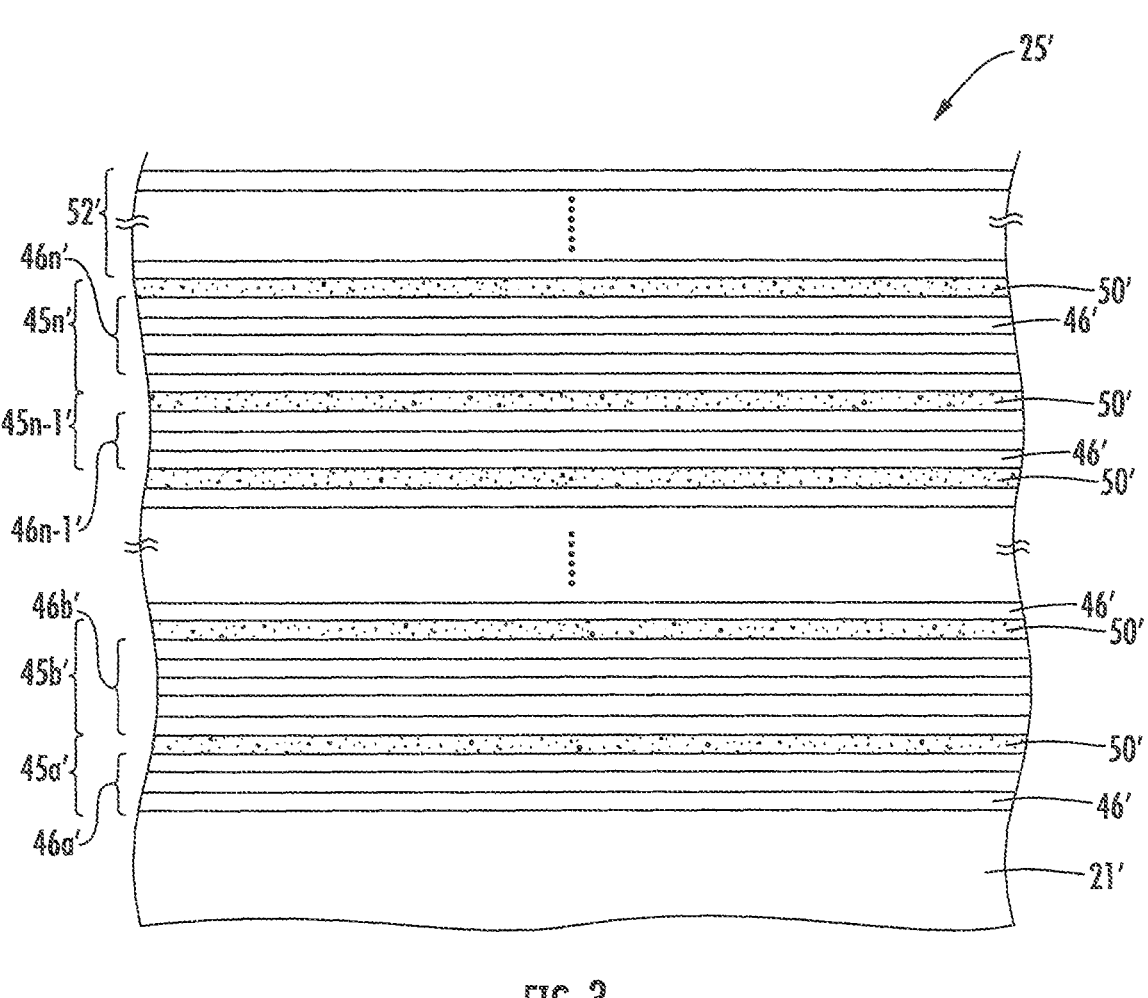
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46*a'* has three monolayers, and the second lowest base semiconductor portion 46*b'* has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
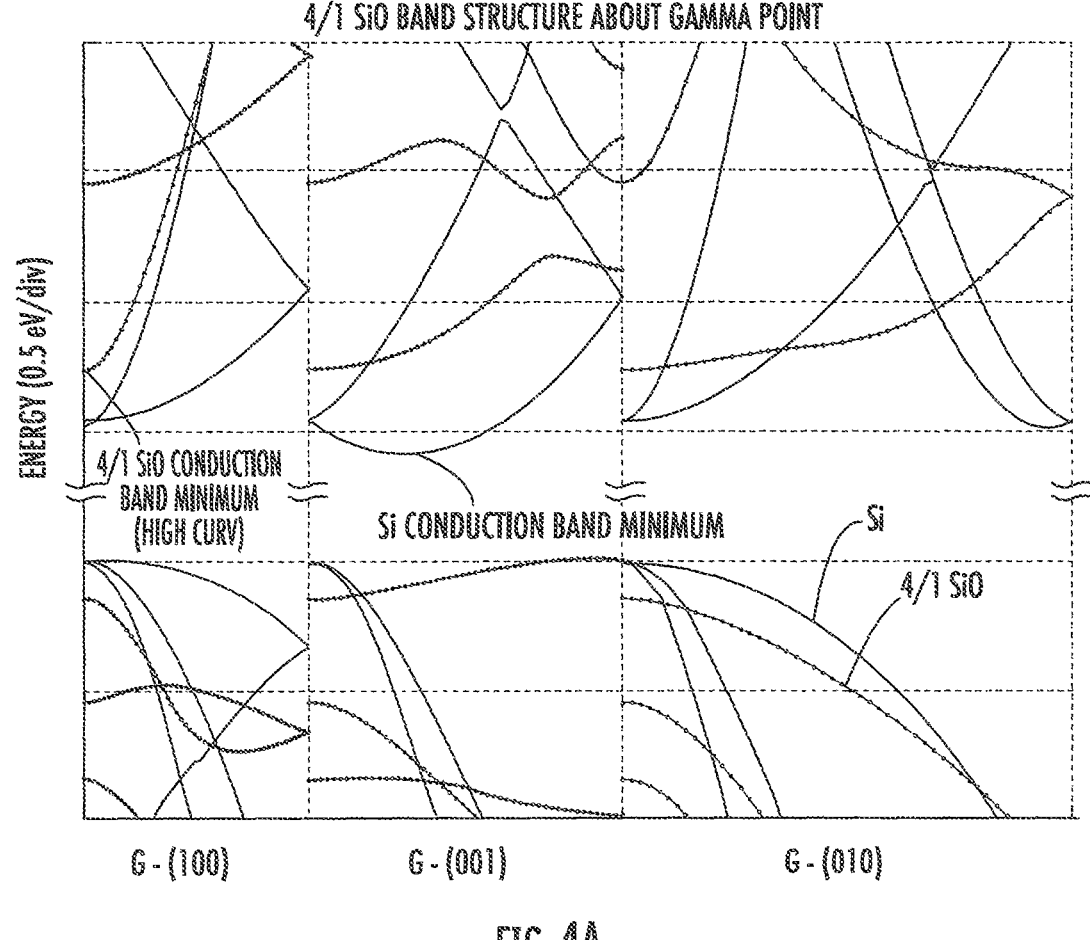
FIG. 4A is a graph of the calculated band structure from the gamma point (G) for both bulk silicon as in the prior art, and for the 4/1 Si/O superlattice as shown in FIGS. 1-2.
Figure 4B:
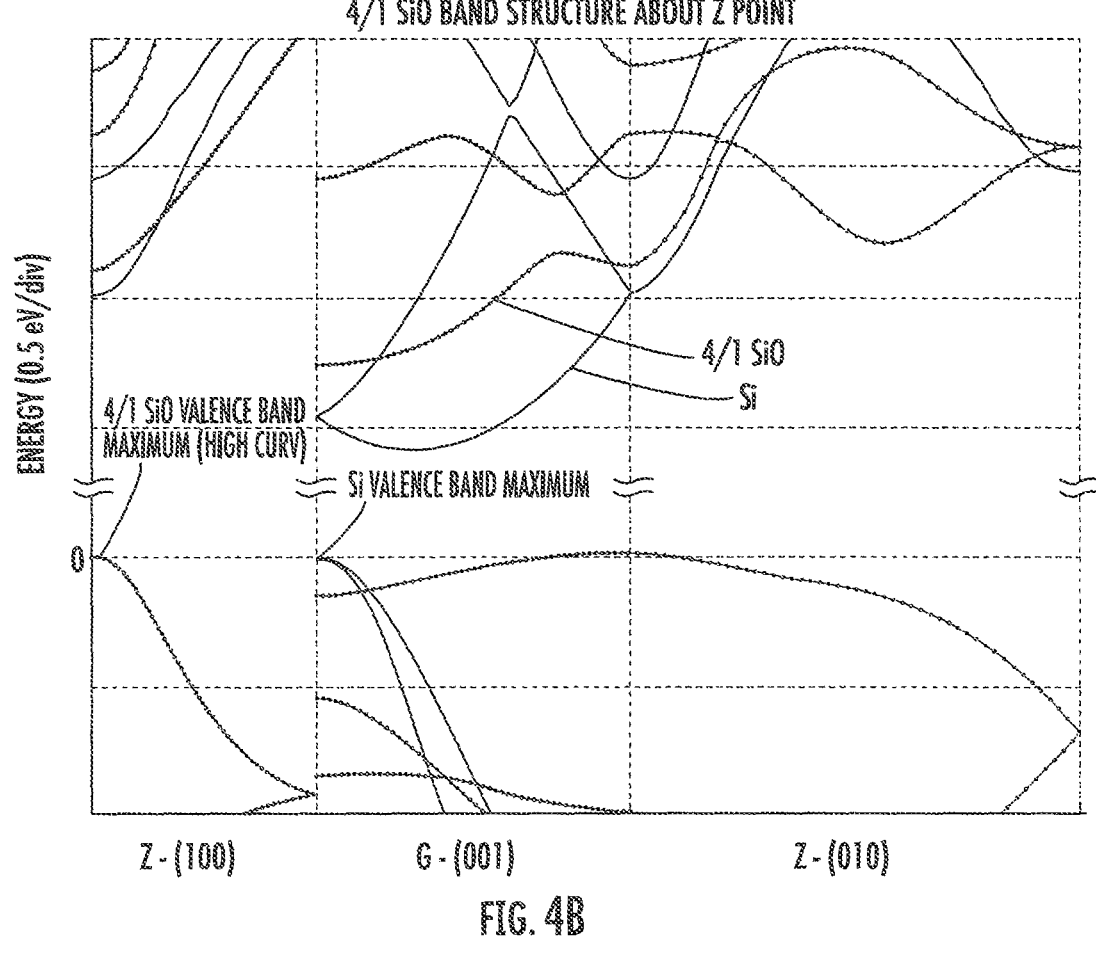
FIG. 4B is a graph of the calculated band structure from the Z point for both bulk silicon as in the prior art, and for the 4/1 Si/O superlattice as shown in FIGS. 1-2.
Figure 4C:
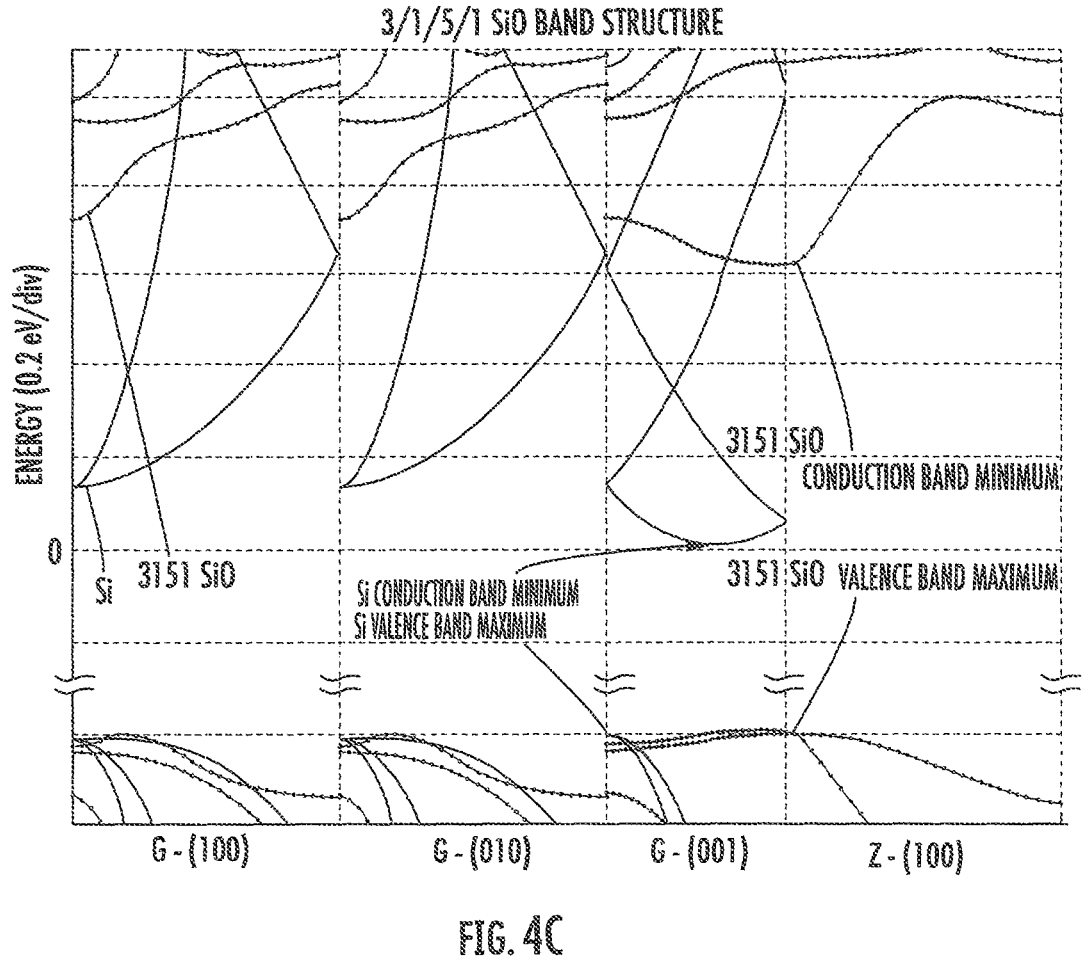
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus, the conductivity effective mass and mobility are expected to be isotropic in the plane parallel to the layers, i.e., perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

A further characteristic of MST technology is that devices having high threshold voltages (Vt) and devices having low threshold voltages may each be optimized separately on the same chip. By optimizing the high threshold voltage devices for minimal leakage, they may be used as headers for reducing leakage in the rest of the periphery during standby mode, while allowing optimization of the low threshold voltage devices in these paths to be even faster than the 70% improvement referred to above during active mode. Further details regarding DRAM memory that incorporates MST films to achieve these technical advantages are provided in the above-noted U.S. Pat. No. 10,109,342, as well as in U.S. Pat. No. 10,107,854 also to Roy, which are hereby incorporated herein in their entireties by reference.

Figure 5:
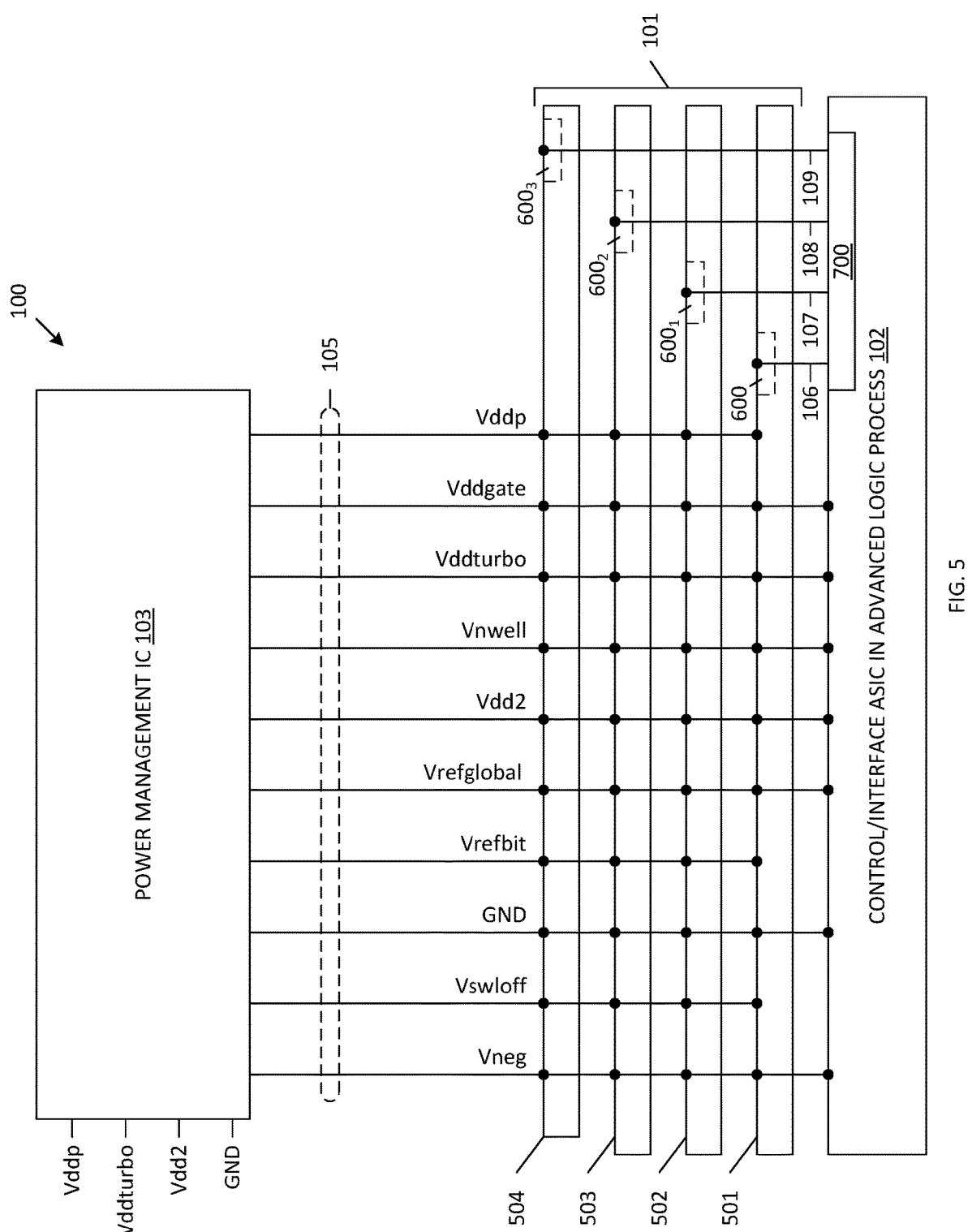
FIG. 5 is a schematic block diagram of a memory system including a control/interface ASIC, a plurality of multi-threaded DRAM chips and a power control integrated circuit in accordance with one embodiment of the present invention.

FIG. 5 is a block diagram of a memory system 100 that illustratively includes a stack 101 of four multi-threaded DRAM (MTDRAM) chips 501-504, a control/interface ASIC 102 (which is fabricated using an advanced logic process) and a power management integrated circuit (PMIC) 103. Although the stack 101 includes four MTDRAM chips 501-504 in the illustrated example, it is understood that the stack 101 can include other numbers of MTDRAM chips in other embodiments. As illustrated by FIG. 5, PMIC 103 provides a plurality of supply/control voltages (i.e., Vddp, Vddgate, Vddturbo, Vnwell, Vdd2, Vrefglobal, Vrefbit, GND, Vswloff and Vneg) in response to received supply voltages (Vddp, Vddturbo, Vdd2 and GND). Further details regarding the voltages used to supply the PMIC 103, as well as the output voltages supplied by the PMIC 103, are set forth in commonly owned, co-pending U.S. patent application Ser. No. 18/311,465 filed May 3, 2023, which is incorporated by reference. Some supply/control voltages (i.e., Vswloff, Vrefbit and Vddp) are only provided to MTDRAM chips 501-504, while other supply/control voltages are shared by the MTDRAM chips 501-504 and the control/interface ASIC 102 to support new logic levels in the control/interface ASIC 102. The various supply/control voltages are routed between PMIC 103, the stack 101 and the control/interface ASIC 102 using a plurality through-silicon via (TSV) structures 105.

Figure 6:
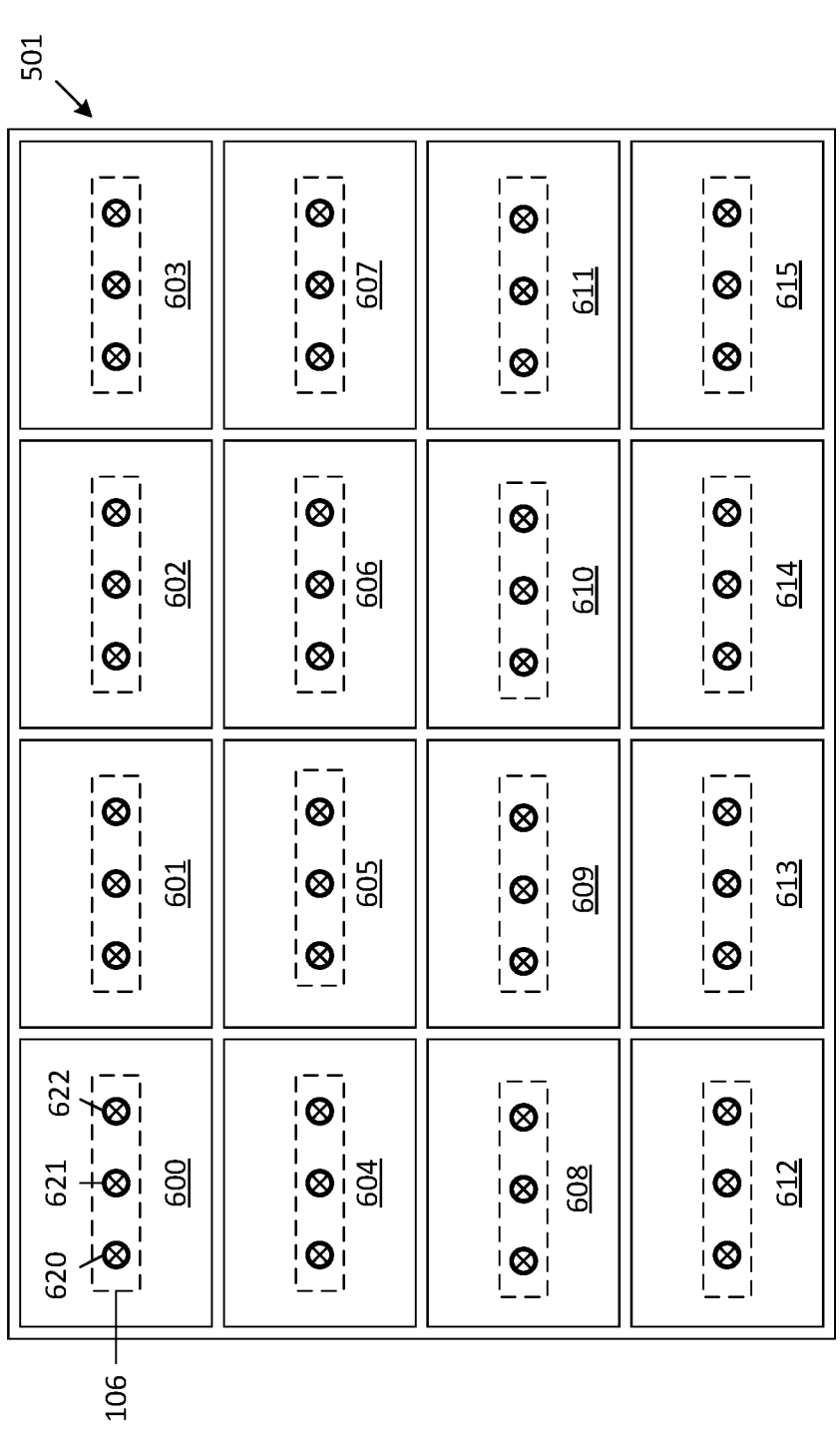
FIG. 6 is top plan view of an exemplary DRAM sector configuration implemented on the multi-threaded DRAM chips of FIG. 5 in accordance with one embodiment of the present invention.

In the present example, the MTDRAM chips 501-504 have an architecture that is enhanced by the above-described MST film and its properties (e.g., enhanced bandwidth). FIG. 6 is a block diagram illustrating an exemplary layout of MTDRAM chip 501 in a 32 Gbit configuration. The MTDRAM chip 501 illustratively includes sixteen (16) 2 Gbit DRAM sectors 600-615, which do not communicate among one another on-chip. Rather, communication between the DRAM sectors 600-615 of the same MTDRAM chip 501 (or between the DRAM sectors 600-615 of MTDRAM chip 501 and the various sectors of the other MTDRAM chips 502-504) is handled by the control/interface ASIC 102, as will be discussed further below. Although MTDRAM chip 501 is described in accordance with a 32 Gbit configuration that includes sixteen 2 Gbit DRAM sectors, it is understood that other memory sizes and configurations are possible in other embodiments.

Each of the DRAM sectors 600-615 includes a corresponding plurality of through-silicon vias (TSVs) for communicating with the control/interface ASIC 102. For example, DRAM sector 600 includes a plurality of TSVs 106 for communicating with the control/interface ASIC 102. The plurality of TSVs 106 generally include a set of TSVs 620 for transmitting control and address information from the control/interface ASIC 102 to the DRAM sector 600, a set of TSVs 621 for transmitting data from the control/interface ASIC 102 to the DRAM sector 600, and a set of TSVs 622 for transmitting data from the DRAM sector 600 to the control/interface ASIC 102. The control and address information transmitted on TSVs 620 specifies read, write and comparison operations to be performed within the DRAM sector 600. The data transmitted on TSVs 621 can include data values to be written to DRAM sector 600 or weight data values to be used in the comparison operations. The data transmitted on TSVs 622 can include data values read from the DRAM sector 600 or data representing the results of the comparison operations. The various TSVs 620-622 included in the plurality of TSVs 106 are described in more detail below. Each of the DRAM sectors 600-615 include identical corresponding sets of TSVs, which enables each of the DRAM sectors 600-615 to be independently accessed from the control/interface ASIC 102.

Although FIG. 6 only illustrates the layout of MTDRAM chip 501, it is understood that all of the MTDRAM chips 501-504 have an identical configuration. Thus, each of the MTDRAM chips 502-504 includes sixteen DRAM 2 Gbit sectors, identical to the DRAM sectors 600-615 described above for MTDRAM chip 501.

Figure 7:
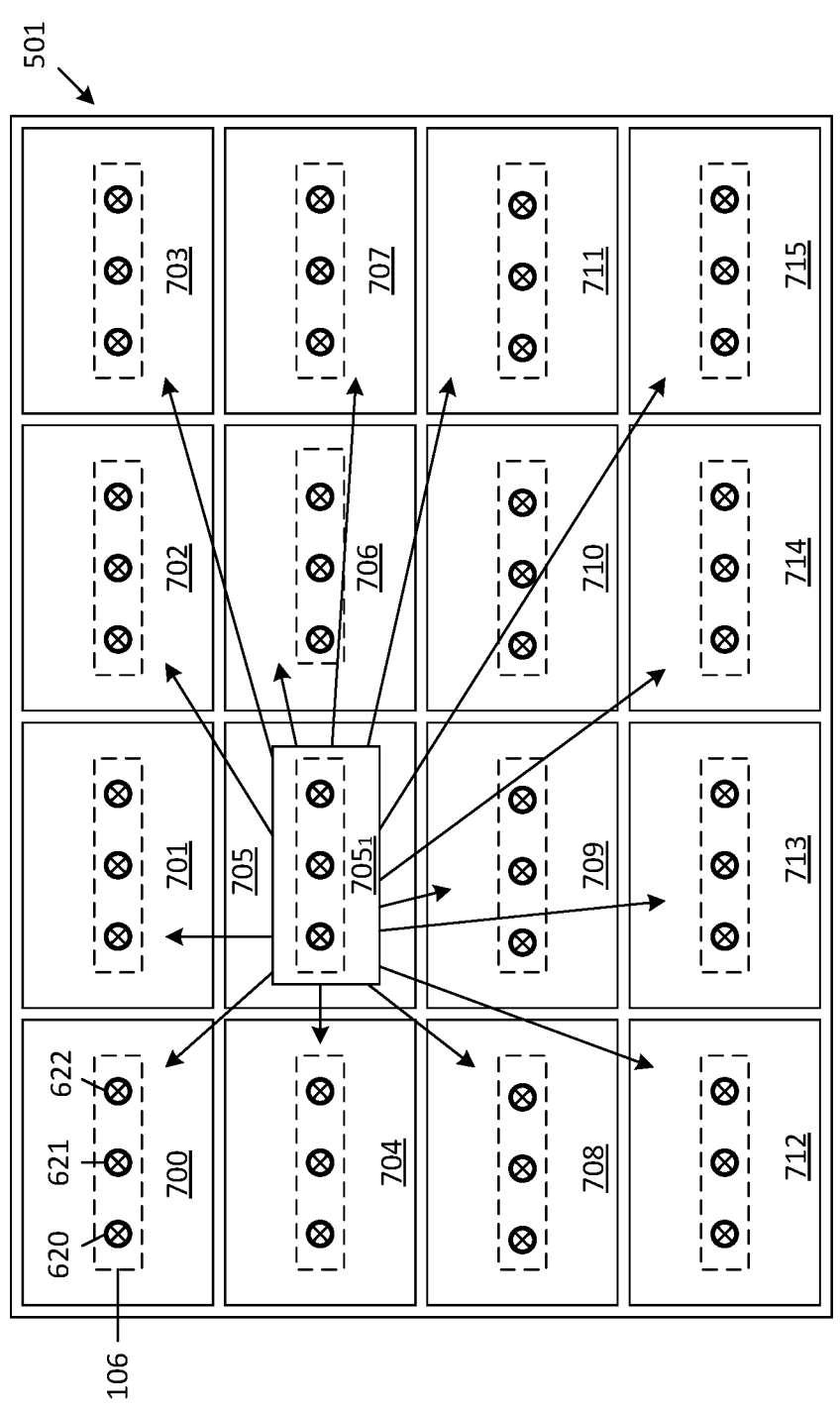
FIG. 7 is a top plan view of an exemplary configuration of processors on the control/interface ASIC of FIG. 5 in accordance with one embodiment of the present invention.

FIG. 7 is a block diagram illustrating the layout of the control/interface ASIC 102 in accordance with one embodiment. Control/interface ASIC 102 includes a plurality of independent processors 700-715, wherein each of the processors 700-715 is connected to a corresponding one of the DRAM sectors 600-615 of the MTDRAM chip 501 by a corresponding set of TSVs. For example, processor 700 on control/interface ASIC 102 is connected to DRAM sector 600 on MTDRAM chip 501 by the above described set of TSVs 106. In this manner, each of the processors 700-715 can perform accesses (e.g., read, write or comparison operations) to its corresponding DRAM sector 600-615, respectively, on MTDRAM chip 501. In addition, each of the processors 701-715 is connected to a corresponding one of the sixteen DRAM sectors on each of the MTDRAM chips 502-504. FIG. 5 generally illustrates TSV structures 106, 107, 108 and 109 that provide connections between the processor 700 of control/interface ASIC 102, and corresponding DRAM sectors 600, 600$_1$, 600$_2$ and 600$_3$, respectively, on the MTDRAM chips 501, 502, 503, and 504, respectively. It is understood that similar TSV structures provide connections between each of the remaining processors 701-715 on control/interface ASIC 102 and corresponding DRAM sectors on each of the MTDRAM chips 501-504.

The interconnect structure of control/interface ASIC 102 is configured to enable full and robust interconnections between all of the processors 700-715. As a result, data retrieved by a processor from its corresponding MTDRAM sector can be shared with each of the other processors on the control/interface ASIC 102. An example of this interconnect structure is illustrated by FIG. 7, wherein data retrieved from MTDRAM sector 605 by processor 705 can be shared with any of the other processors 700-704 and 706-715, as illustrated by interconnect network 705$_1$, which represents a portion of the interconnect structure included on the control/interface ASIC 102. Note that the data retrieved from MTDRAM sector 605 can be data read directly from the DRAM banks of MTDRAM sector 605, or data corresponding with the results of comparison operations performed within MTDRAM sector 605, which are described in more detail below. Although FIG. 7 only illustrates the interconnect network 705$_1$ that exists between processor 705 and the other processors 700-704 and 706-715, it is understood that each of other the processors 701-704 and 706-715 has a similar corresponding interconnect network, thereby enabling each of the processors 700-715 to transfer data to/from each of the other processors 700-715. Note that it is easier to implement multiple metal interconnect layers on the control/interface ASIC 102 than on the MTDRAM chip 501, because the advanced logic process used to fabricate the control/interface ASIC 102 typically has eight to ten metal layers (although other numbers of metal layers may be used in other embodiments). Moreover, dimensions achievable in circuitry of the control/interface ASIC 102 tend to be much smaller than the dimensions achievable in the processes typically used to fabricate DRAM devices. For example, 5 nm (or even 3 nm) processes can be used to fabricate ASIC logic circuitry, whereas processes typically used to fabricate DRAM devices are typically a generation or more behind in size. Furthermore, TSV sizes in processes used to fabricate ASIC logic circuitry may be on the order of 1 μm, whereas TSV sizes in processes used to fabricate DRAM devices may be on the order of 30 μm. Thus, utilizing direct TSVs between each of the DRAM sectors 600-615 of the MTDRAM chip 501 and the control/interface ASIC 102, while incorporating inter-sector connections on the control/interface ASIC 102, allows for multiple different processes to be performed in different sectors in parallel, much like the structure of the human brain. In this regard, the present architecture is particularly well suited for artificial intelligence (AI) applications, although it may be used for other applications as well.

Figure 8:
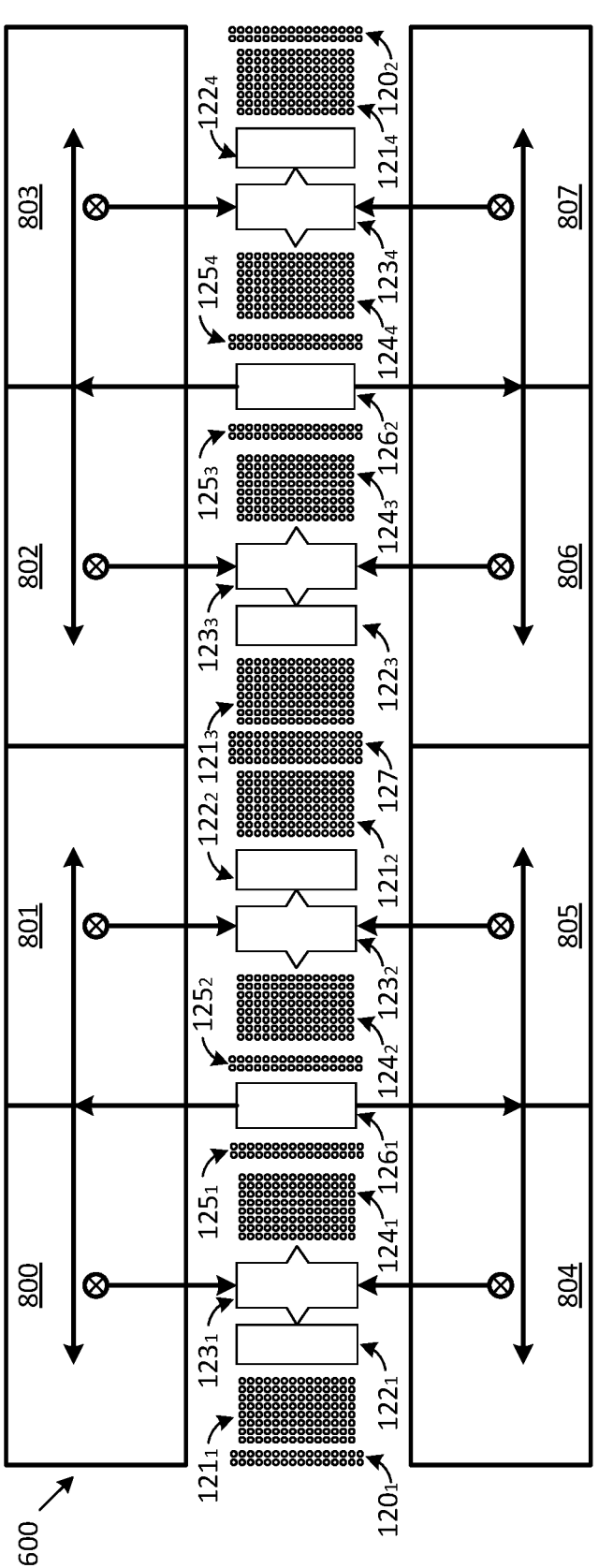
FIG. 8 is a top plan view of a DRAM sector of FIG. 6 in accordance with one embodiment of the present invention.

FIG. 8 is a schematic diagram illustrating a signal interconnect configuration for 2 Gbit DRAM sector 600 in accordance with one embodiment. The 2 Gbit DRAM sector 600 is logically divided into eight DRAM arrays 800-807, wherein each of these arrays includes 16 DRAM banks (such that the 2 Gbit DRAM sector 600 includes a total of 128 DRAM banks). Each of these DRAM banks includes a 4096×4096 array of DRAM memory cells. The interconnect components of DRAM sector 600 include: control/secondary address TSVs 120$_1$-120$_2$, comparator output TSVs 121$_1$-121$_4$, comparator arrays 122$_1$-122$_4$, output circuitry 123$_1$-123$_4$, raw output TSVs 124$_1$-124$_4$, data input TSVs 125$_1$-125$_4$, data input circuitry 126$_1$-126$_2$, and primary address TSVs 127. In general, processor 700 of control/interface ASIC 102 provides control/address information to DRAM sector 600 via TSVs 120$_1$-120$_2$ and 127 (which are generally represented by the plurality of TSVs 620 in FIGS. 6-7). This control/address information specifies read, write and comparison operations to be performed by DRAM sector 600. A read operation is performed by reading data from one or more of the DRAM arrays 800-807, based on the address information provided on TSVs 120$_1$-120$_2$ and 127. Read data is routed from the DRAM arrays 800-807 to the output circuitry 123$_1$-123$_4$. This read data is routed from the output circuitry 123$_1$-123$_4$ to the processor 700 of controller/interface ASIC 102 via the raw output TSVs 124$_1$-124$_4$ (which are generally represented by the plurality of output data TSVs 622 in FIGS. 6-7). To perform a write operation, the processor 700 of controller/interface ASIC 102 transmits write data to the data input circuitry 126$_1$-126$_2$ of DRAM sector 600 via the data input TSVs 125$_1$-125$_4$ (which are generally represented by the plurality of input data TSVs 621 in FIGS. 6-7). The data input circuitry 126$_1$-126$_2$ writes the received write data to one or more of the DRAM arrays 800-807, based on write address information provided by the processor 700 on TSVs 120$_1$-120$_2$ and 127.

As described in more detail below, the processor 700 of the control/interface ASIC 102 initiates a comparison operation by transmitting control/address information (i.e., a comparison instruction) on TSVs 120$_1$-120$_2$ and 127 that specifies a comparison operation to the corresponding DRAM sector 600. The comparison instruction includes address information that specifies the data values to be read from the DRAM arrays 801-807 and provided to the comparator arrays 122$_1$-122$_4$ for the comparison operation. Along with the comparison instruction, processor 700 provides weight data values to comparator arrays 122$_1$-122$_4$ (through data input TSVs 125$_1$-125$_4$ and data input circuitry 126$_1$-126$_2$). In response, comparator arrays 122$_1$-122$_4$ perform comparison operations, and provide comparison output signals to control/interface ASIC 102 via the comparator output TSVs 121$_1$-121$_4$ (which are generally represented by the plurality of output data TSVs 622 in FIGS. 6-7).

Note that input data to DRAM sector 600 is routed on input TSVs 125$_1$-125$_4$, while output data from DRAM sector 600 is routed on separate data output TSVs 124$_1$-124$_4$ and 121$_1$-121$_4$, rather than routing input and output data on shared I/O lines, as is typical of conventional DRAMs. Also note that the data output circuitry 123$_1$-123$_4$ can be controlled to route data received from DRAM arrays 801-807 to data output TSVs 124$_1$-124$_4$ and/or comparator arrays 122$_1$-122$_4$, providing flexibility in the manner of routing output data from DRAM arrays 801-807. Similarly, the data input circuitry 126$_1$-126$_2$ can be controlled to route data received from the processor 700 to the DRAM arrays 801-807 and/or to comparator arrays 122$_1$-122$_4$, providing flexibility in the manner that input data from processor 700 is routed within the DRAM sector 600.

In the illustrated embodiment, on-chip logic required for DRAM sector 600 is advantageously limited to the comparator arrays 122$_1$-122$_4$, the data output circuitry 123$_1$-123$_4$ and the data input circuitry 126$_1$-126$_2$, with any remaining logic components being incorporated in the control/interface ASIC 102.

Figure 9A:
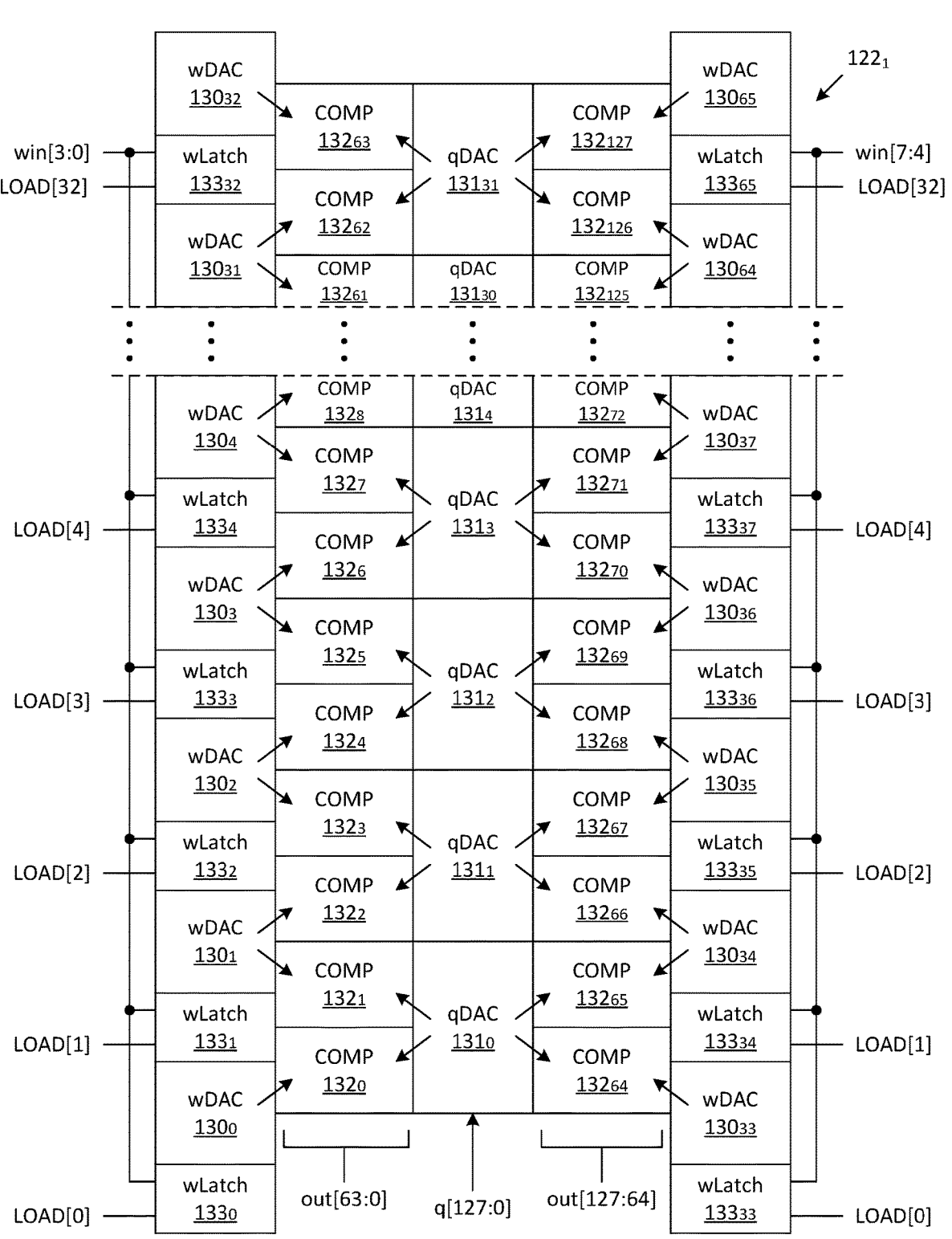
FIGS. 9A and 9B are schematic block diagrams of comparator arrays implemented in the DRAM sector of FIG. 7 in accordance with various embodiments of the present invention.

A comparison operation implemented by DRAM sector 600 in accordance with one embodiment of the present invention will now be described. FIG. 9A is a block diagram illustrating the comparator array 122$_1$ of FIG. 8, in accordance with one embodiment of the present invention. In the illustrated embodiment, comparator array 122$_1$ includes a plurality of comparator circuits 132$_0$-132$_{127}$, a plurality of input data digital-to-analog converters qDACs 131$_0$-131$_{31}$, a plurality of weight data digital-to-analog converters (wDACs) 130$_0$-130$_{65}$, and a plurality of weight data latches (wLatches) 133$_0$-133$_{65}$. The qDACs 131$_0$-131$_{31}$ are configured to receive a q-data value q[127:0] read from the DRAM array(s) 800 and/or 804. More specifically, each qDAC 131$n$ is configured to receive four bits q[(4n+3):(4n)] of the q-data value q[127:0]. Thus, qDAC 131$_0$ receives bits q[3:0], qDAC 131$_1$ receives bits q[7:4] and qDAC 131$_{31}$ receives bits q[127:124] of the q-data value q[127:0].

The wLatches 133$_0$-133$_{65}$ are configured to store corresponding 4-bit weight data values $w_0$[3:0]-$w_{65}$[3:0], respectively, which are sequentially provided by processor 700 of control/interface ASIC 102 via data input TSVs 125$_1$ and data input circuitry 126$_1$ on a weight input data bus win[7:0]. The weight data values $w_0$[3:0]-$w_{32}$[3:0] are sequentially provided on the weight input data bus win[3:0], and are written to the wLatches 133$_0$-133$_{32}$, respectively, in response to load address signals LOAD[0]-LOAD[32], respectively. Similarly, the weight data values $w_{33}$[3:0]-$w_{65}$[3:0] are sequentially provided on the weight input data bus win[7:4], and are written to the wLatches 133$_{33}$-133$_{65}$, respectively, in response to load address signals LOAD[0]-LOAD[32], respectively.

In one embodiment, the load address signals LOAD[0]-LOAD[32] are provided by processor 700 of control/interface ASIC 102 via control/secondary address TSVs 120$_1$. In another embodiment, the load address signals LOAD[0]-LOAD[32] generated on MTDRAM chip 501 by decoding a 5-bit load address value provided by processor 700 of control ASIC 102 via control/secondary address TSVs 120$_1$.

In one embodiment, only one of the load address signals LOAD[0]-LOAD[32] is activated at a time. For example, the desired weight data values $w_0$[3:0] and $w_{33}$[3:0] are provided on input data buses win[3:0] and win[7:0], respectively, and the load address signal LOAD[0] is activated, thereby simultaneously writing the desired weight data values $w_0$[3:0] and $w_{33}$[3:0] into wLatches 133$_0$ and 133$_{33}$, respectively. The desired weight data values $w_1$[3:0] and $w_{34}$[3:0] are then provided on input data buses win[3:0] and win[7:0], respectively, and the next load address signal LOAD[1] is activated, thereby simultaneously writing the desired weight data values $w_1$[3:0] and $w_{34}$[3:0] into wLatches 133$_1$ and 133$_{34}$, respectively. This process is repeated, sequentially activating the load address signals LOAD[0]-LOAD[32] until all of the desired weight data values $w_0$[3:0]-$w_{65}$[3:0] are written into the corresponding wLatches 133$_0$-133$_{65}$. In one embodiment, the write operations to wLatches 133$_0$-133$_{65}$ are performed at the relatively high rate of 2 GHz. The circuitry used to implement the wLatches 133$_0$-133$_{65}$ is described in more detail below in connection with FIG. 10.

The 4-bit weight data values $w_0$[3:0]-$w_{65}$[3:0] stored by the wLatches 133$_0$-133$_{65}$ are provided to the corresponding wDACs 130$_0$-130$_{65}$, respectively, to implement comparison operations in a manner described in more detail below.

The comparator circuits 132$_0$-132$_{127}$ are interleaved between the qDACs 131$_0$-131$_{31}$ and the wDACs 130$_0$-130$_{65}$, in the manner illustrated. The qDACs 131$_0$-131$_{31}$ are arranged in a single column, with comparator circuits 132$_0$-132$_{63}$ arranged in a single column to the left of these qDACs, and comparator circuits 132$_{64}$-132$_{127}$ arranged in a single column to the right of these qDACs. Each of the qDACs 131$_0$-131$_{31}$ provides an analog signal representative of its corresponding 4-bit q-data value to four of the comparator circuits 132$_0$-132$_{127}$. For example, the qDAC 131$_0$ provides an analog signal representative of q[3:0] to each of the comparator circuits 132$_0$, 132$_1$, 132$_{64}$ and 132$_{65}$. This advantageously enables each of the 4-bit q-data values to be used in four comparison operations simultaneously.

The wDACs 130$_0$-130$_{32}$ are arranged in a first column to the left of comparator circuits 132$_0$-132$_{63}$, and the wDACs 130$_{33}$-130$_{65}$ are arranged in a second column to the right of comparator circuits 132$_{64}$-132$_{127}$. Each of the wDACs 130$_1$-130$_{31}$ provides an analog signal representative of its corresponding 4-bit weight data value to two of the comparator circuits 132$_1$-132$_{62}$ (and each of the wDACs 130$_0$ and 130$_{32}$ provides an analog signal representative of its corresponding 4-bit weight data value to comparator circuits 132$_0$ and 132$_{63}$, respectively). For example, the wDAC 130$_1$ provides an analog signal representative of its corresponding 4-bit weight data value $w_1$[3:0] to comparator circuits 132$_1$ and 132$_2$.

Similarly, each of the wDACs 130$_{34}$-130$_{64}$ provides an analog signal representative of its corresponding 4-bit weight data value to two of the comparator circuits 132$_{65}$-132$_{126}$ (and each of the wDACs 130$_{33}$ and 130$_{65}$ provides an analog signal representative of its corresponding 4-bit weight data value to comparator circuits 132$_{64}$ and 132$_{127}$, respectively). For example, the wDAC 130$_{34}$ provides an analog signal representative of its 4-bit weight data value $w_{34}$[3:0] to comparator circuits 132$_{65}$ and 132$_{66}$. This advantageously enables most of the 4-bit weight data values to be used in two comparison operations simultaneously.

Each of the comparator circuits 132$_0$-132$_{127}$ provides a corresponding comparison output signal out[0]-out[127], respectively, which specifies the result of a comparison operation implemented by the comparator circuit. The circuitry used by the comparator circuits 132$_0$-132$_{127}$, qDACs 131$_0$-131$_{31}$ and wDACs 130$_0$-130$_{65}$ to perform the comparison operations is described in more detail below in connection with FIG. 11.

Although the embodiment illustrated in FIG. 9A includes one column of qDACs 131$_0$-131$_{31}$, two columns of comparator circuits 132$_0$-132$_{63}$ and 132$_{64}$-132$_{127}$, and two columns of wDACs 130$_0$-130$_{33}$ and 130$_{34}$-130$_{64}$ (with corresponding columns of wLatches $133_0$-$133_{33}$ and $133_{34}$-$133_{65}$), it is understood that this configuration can be expanded horizontally to include additional columns. An example of such a column expansion is described below.

Figure 9B:
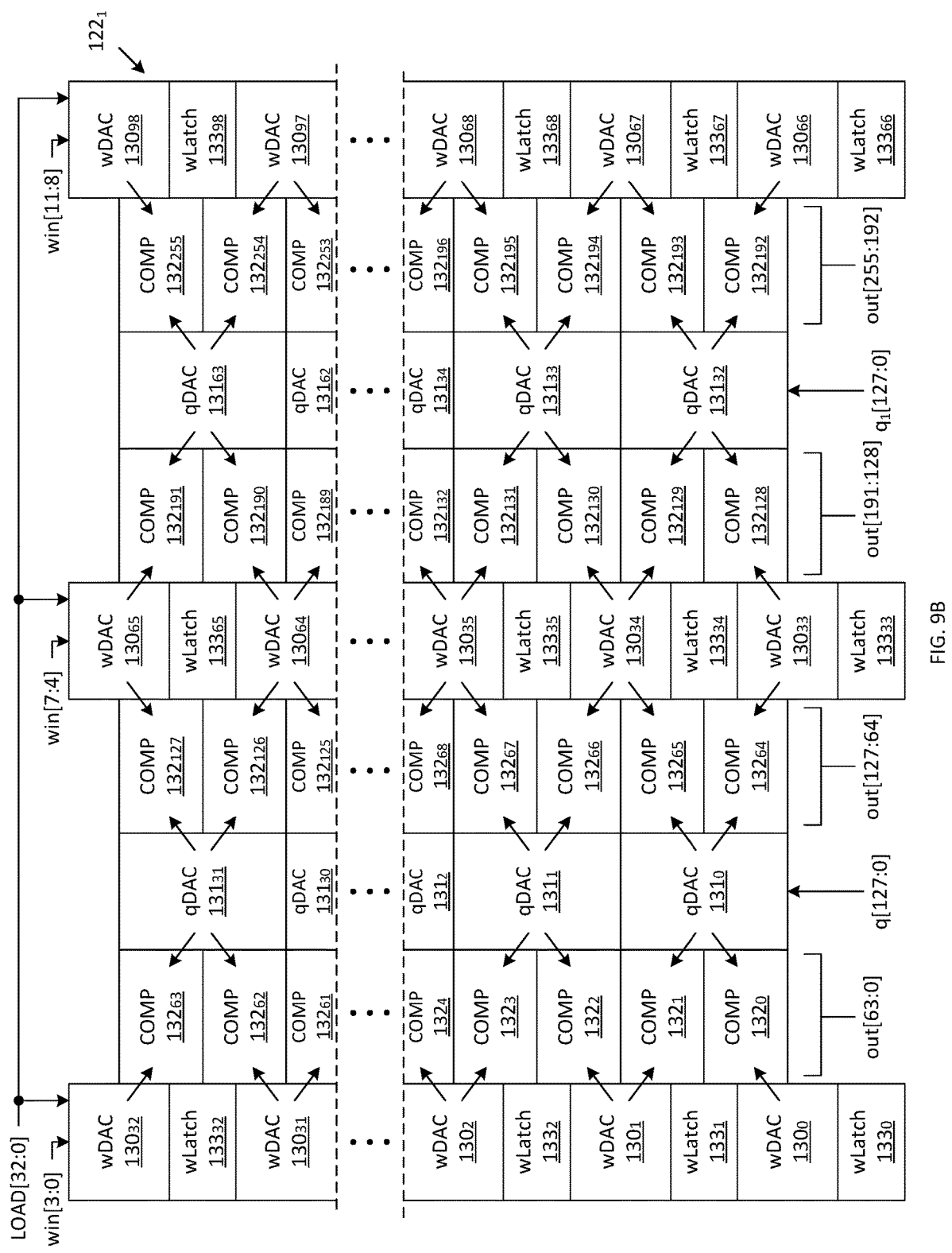

FIG. 9B is a block diagram illustrating the comparator array $122_1$ of FIG. 8, in accordance with an embodiment of the present invention that includes an additional column of qDACs $131_{32}$-$131_{63}$, two additional columns of comparators $132_{128}$-$132_{191}$ and $132_{192}$-$132_{255}$, and one additional column of wDACs $130_{66}$-$130_{98}$ (with a corresponding column of wLatches $133_{34}$-$133_{65}$). The first five columns of the comparator array of FIG. 9B are identical to the first five columns of the comparator array of FIG. 9A (and are therefore labeled with the same reference numbers). In general, the comparator array $122_1$ includes alternating columns of wDACs and qDACs, with intervening columns of comparator circuits located between adjacent wDAC and qDAC columns.

In addition to the connections described above in connection with FIG. 9A, each of the wDACs $130_{34}$-$130_{64}$ provides an analog signal representative of its corresponding 4-bit weight data value to two of the comparator circuits $132_{129}$-$132_{190}$ (and each of the wDACs $130_{33}$ and $130_{65}$ provides an analog signal representative of its corresponding 4-bit weight data value to comparator circuits $132_{128}$ and $132_{191}$, respectively). For example, the wDAC $130_{34}$ provides a signal representative of its 4-bit weight data value $w_{34}[3:0]$ to comparator circuits $132_{129}$ and $132_{130}$. This advantageously enables each of the 4-bit weight data values $w_{33}[3:0]$-$w_{65}[3:0]$ to be used in four comparison operations simultaneously.

The additional column of qDACs $131_{32}$-$131_{63}$ is configured to store q-data values $q_1[127:0]$ read from the DRAM array(s) 800 and/or 804. Each of the qDACs $131_{32}$-$131_{63}$ stores four q-data bits of the q-data values $q_1[127:0]$ (in the same manner that each of the qDACs $131_0$-$131_{31}$ stores four q-data bits of the q-data value $q[127:0]$). In one embodiment, the q-data values $q[127:0]$ and $q_1[127:0]$ are different data values read from the DRAM array(s) 800 and/or 804. In another embodiment, the q-data value $q_1[127:0]$ is formed by re-ordering the 4-bit q-data values of the q-data value $q[127:0]$ within the second column of qDACs $131_{32}$-$131_{63}$. These configurations are necessary to ensure that the column of comparator circuits $132_{128}$-$132_{191}$ does not duplicate the comparisons performed by the column of comparator circuits $132_{64}$-$132_{127}$. Each of the qDACs $131_{32}$-$131_{63}$ is configured to output an analog signal representative of its corresponding 4-bit q-data value to two of the comparator circuits $132_{128}$-$132_{191}$ and two of the comparator circuits $132_{192}$ and $132_{255}$, as illustrated.

The additional column of wDACs $130_{66}$-$130_{98}$ and wLatches $133_{66}$-$133_{98}$ are configured such that the wLatches $133_{66}$-$133_{98}$ store a corresponding plurality of weight data values $w_{66}[3:0]$-$w_{98}[3:0]$, respectively. These weight data values $w_{66}[3:0]$-$w_{98}[3:0]$ are sequentially written from the weight input data bus win[11:8] into the corresponding wLatches $133_{66}$-$133_{98}$, respectively, by the sequentially activated load address signals LOAD[0]-LOAD[32], respectively. For example, the weight data values provided on weight input data buses win[3:0], win[7:4] and win[11:4] are written into wLatches $133_1$, $133_{34}$ and $133_{67}$, respectively, as the weight data values $w_1[3:0]$, $w_{34}[3:0]$ and $w_{67}[3:0]$, respectively, in response to activating the load address signal LOAD[1].

Each of the wDACs $130_{67}$-$130_{97}$ provides an analog output signal representative of its corresponding 4-bit weight data value to two of the comparator circuits $132_{193}$-

$132_{254}$ (and each of the wDACs $130_{66}$ and $130_{98}$ provides an analog signal representative of its corresponding 4-bit weight data value to comparator circuits $132_{192}$ and $132_{255}$, respectively).

The each of the comparator circuits $132_{128}$-$132_{255}$ provides a corresponding output signal out[128]-out[255], respectively, which specifies a result of a comparison operation implemented by the comparator circuit. Thus, expanding the width of the comparator array $122_1$ in the manner specified by FIG. 9B doubles the number of comparison results provided. In a particular embodiment, the comparator array $122_1$ can be further expanded (doubled) to provide 512 output results (i.e., out[0:511]).

Figure 10:
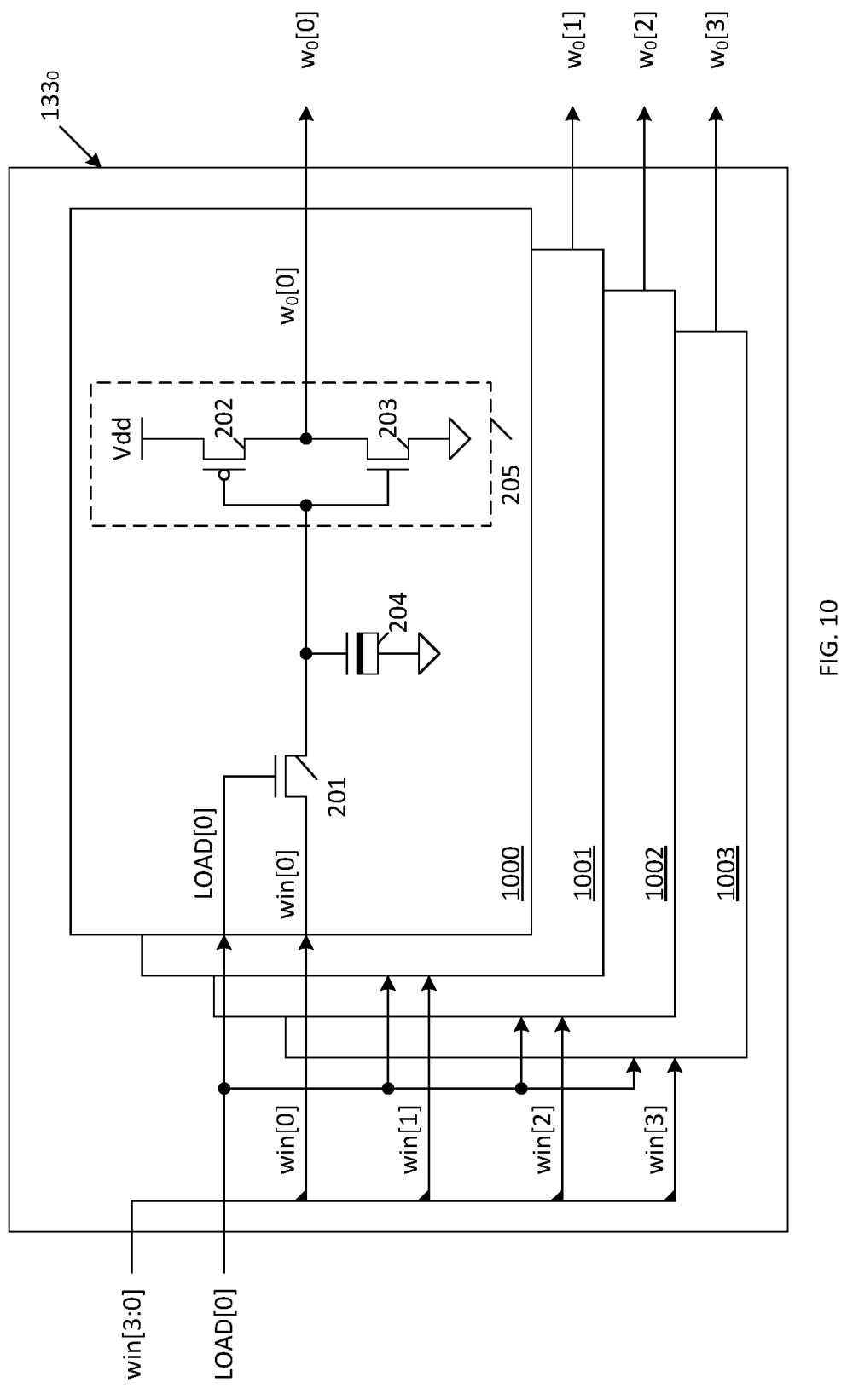
FIG. 10 is a schematic circuit of latches which may be used in the comparator arrays of FIGS. 9A and 9B in accordance with various embodiments of the present invention.

FIG. 10 is a circuit diagram illustrating wLatch $133_0$ in accordance with one embodiment of the present invention. The wLatches $133_1$-$133_{98}$ have the same circuit structure as wLatch $133_0$, although each of the wLatches $133_0$-$133_{98}$ receives different input values. More specifically, the wLatches $133_0$-$133_{32}$ are configured to receive load address signals LOAD[0]-LOAD[32], respectively. Each of the wLatches $133_0$-$133_{32}$ is further configured to receive the 4-bit weight data value provided on weight input data bus, win[3:0]. Similarly, the wLatches $133_{33}$-$133_{65}$ are configured to receive load address signals LOAD[0]-LOAD[32], respectively. Each of the wLatches $133_{33}$-$133_{65}$ is further configured to receive the 4-bit weight data value provided on weight input data bus, win[7:4]. Finally, the wLatches $133_{66}$-$133_{98}$ are configured to receive load address signals LOAD[0]-LOAD[32], respectively. Each of the wLatches $133_{66}$-$133_{98}$ is further configured to receive the 4-bit weight data value provided on weight input data bus, win[11:8].

Weight data values are simultaneously written to wLatches $133_0$, $133_{33}$ and $133_{66}$, by providing the desired 4-bit weight data values on the weight input data buses win[3:0], win[7:4] and win[11:8], and activating the load address signal LOAD[0]. Weight data values are then simultaneously written to wLatches $133_1$, $133_{34}$ and $133_{67}$, by providing the desired 4-bit weight data values on the weight input data buses win[3:0], win[7:4] and win[11:8], and activating the load address signal LOAD[1]. This pattern is continued (over a total of 33 write cycles) to write the desired weight data values to all of the wLatches $133_0$-$133_{98}$.

As illustrated by FIG. 10, wLatch $133_0$ includes four latch circuits 1000-1003. Latch circuit 1000 includes n-channel pass gate transistor 201, storage capacitor 204 and inverter 205 (which includes p-channel transistor 202 and n-channel transistor 203, which are connected as illustrated). The weight data value on weight input data bus line win[0] is provided to the source of pass gate transistor 201, and the load address signal LOAD[0] is provided to the gate of pass gate transistor 201.

To load the weight data bit win[0] into latch circuit 1000, the load address signal LOAD[0] (which is normally low) is activated high, turning on pass gate transistor 201. Under these conditions, the voltage applied to storage capacitor 204 depends on the value of the weight data bit win[0].

If the weight data bit win[0] has a logic '1' value (i.e., win[0]=Vdd), then the storage capacitor 204 is charged to the Vdd supply voltage minus the threshold voltage (Vt) of the pass gate transistor 201, which must be higher than the trip point of inverter 205. Under these conditions, transistor 203 is turned on (and transistor 202 is turned off), such that the weight data bit wo[0] is pulled down to ground.

If the weight data bit win[0] has a logic '0' value (i.e., win[0]=0V), then the storage capacitor 204 is discharged to ground. Under these conditions, transistor 202 is turned on (and transistor 203 is turned off), such that the weight data bit $w_0[0]$ is pulled up to Vdd.

Although only the circuitry of latch circuit 1000 is illustrated, it is understood that all of the latch circuits 1000-1003 include identical circuitry. Latch circuits 1001, 1002 and 1003 latch the weight data bits win[1], win[2] and win[3], respectively, in response to the load signal LOAD[0], thereby providing the output weight data bits $w_0[1]$, $w_0[2]$ and $w_0[3]$, respectively.

In accordance with one embodiment, the wLatches $133_0$-$133_{98}$ store weight data values that change relatively infrequently compared to the q-data values, which are retrieved from the DRAM arrays 800-807 at a much higher bandwidth. As a result the weight input data bus win[11:0] can operate at relatively low frequency. The rate at which the LOAD[32:0] signals are sequentially activated corresponds with an input clock signal for loading weight data values to the wLatches $133_0$-$133_{98}$. The use of dynamic latches to store the weight data values in the wLatches as shown in FIG. 10 requires periodic refresh, but the power is negligible, while the area savings and voltage headroom reduction compared to SRAM-based latches is significant. The refresh interval for the latch circuit 1000 can be extended by increasing the value of capacitance 204.

Figure 11:
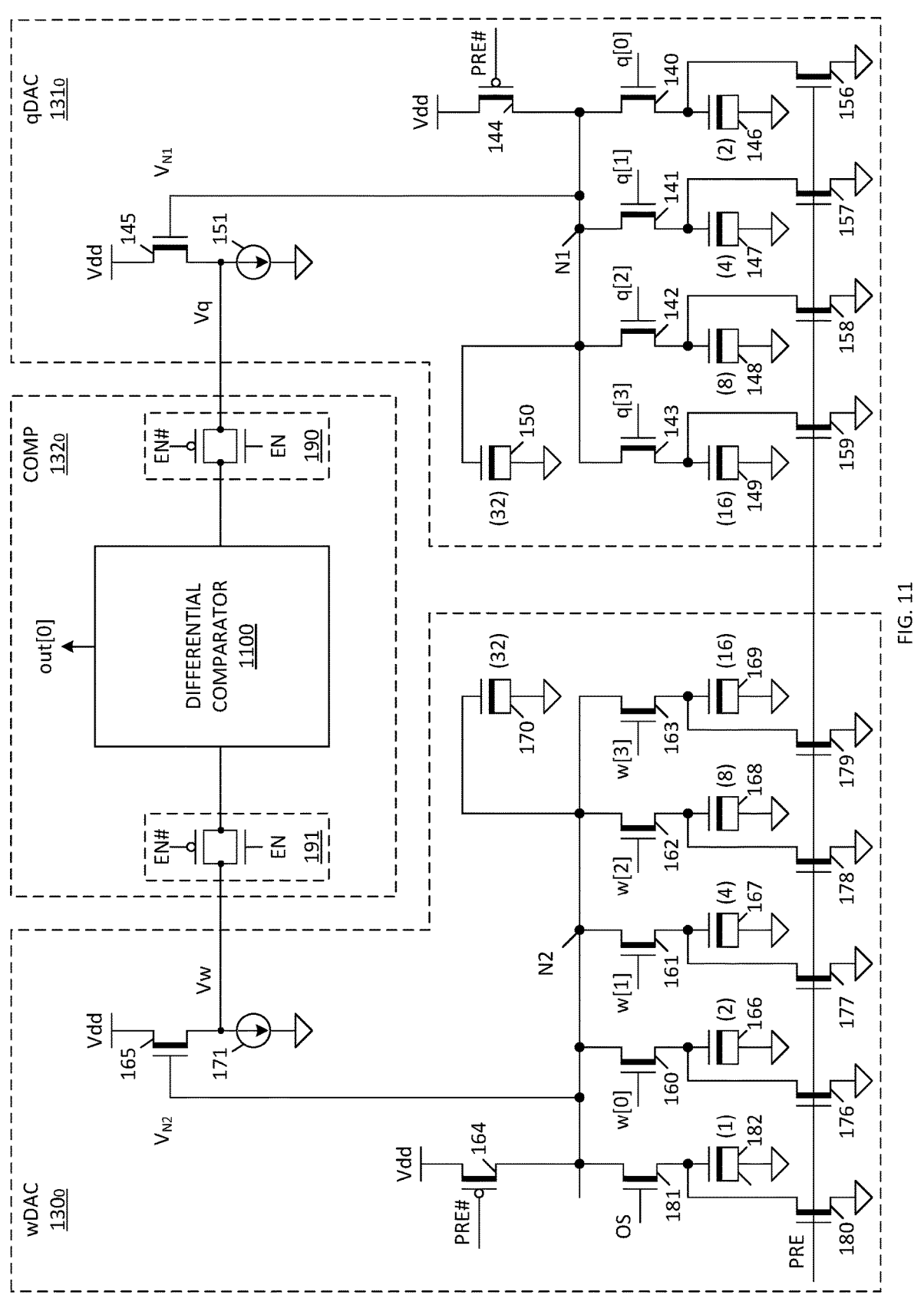
FIG. 11 is a schematic circuit diagram illustrating an exemplary implementation of the comparator arrays of FIGS. 9A and 9B in accordance with one embodiment of the present invention.

FIG. 11 is a circuit diagram illustrating wDAC $130_0$, qDAC $131_0$ and comparator circuit $132_0$, in accordance with one embodiment. It is understood that the remaining wDACs, qDACs and comparator circuits of the comparator array $122_1$ have the same circuitry illustrated by FIG. 11.

The qDAC $131_0$ includes n-channel charging transistors 140-143, p-channel pre-charge transistor 144, n-channel output transistor 145, capacitor structures 146-150, constant current source 151 and n-channel pre-charge transistors 156-159. N-channel charging transistors 140, 141, 142 and 143 have gates coupled to receive the q-data signals q[0], q[1], q[2] and q[3], respectively, drains coupled to node N1, and sources coupled to capacitor structures 146, 147, 148 and 149, respectively. The capacitor structures 146-149 are further coupled to ground. Capacitor structure 150 is coupled between node N1 and ground. P-channel pre-charge transistor 144 has a gate coupled to receive a pre-charge control signal PRE #, a source coupled to receive the Vdd supply voltage, and a drain coupled to node N1. N-channel pre-charge transistors 156-159 have gates coupled to receive the complementary pre-charge control signal PRE, sources coupled to ground, and drains coupled to capacitor structures 146, 147, 148 and 149, respectively, as illustrated. Output transistor 145 has a gate coupled to node N1, a source coupled to receive the Vdd supply voltage, and a drain coupled to constant current source 151. The voltage on the drain of the output transistor 145 is provided to comparator $132_0$ as the analog input voltage Vq.

The wDAC $130_0$ includes n-channel charging transistors 160-163, p-channel pre-charge transistor 164, n-channel output transistor 165, n-channel offset transistor 181, capacitor structures 166-170 and 182, constant current source 171 and re-channel pre-charge transistors 176-180. N-channel transistors 160, 161, 162 and 163 have gates coupled to receive the weight input data bits w[0], w[1], w[2] and w[3], respectively, drains coupled to node N2, and sources coupled to capacitor structures 166, 167, 168 and 169, respectively. The capacitor structures 166-169 are further coupled to ground. Capacitor structure 170 is coupled between node N2 and ground. Offset transistor 181 has a gate coupled to receive an offset control signal (OS), a source coupled to node N2, and a source coupled to capacitor structure 182 (which is further connected to ground).

P-channel pre-charge transistor 164 has a gate coupled to receive the pre-charge control signal PRE #, a source coupled to receive the Vdd supply voltage, and a drain coupled to node N2. N-channel pre-charge transistors 176-180 have gates coupled to receive the pre-charge control signal PRE, sources coupled to ground, and drains coupled to capacitor structures 166, 167, 168, 169 and 182, respectively, as illustrated. Output transistor 165 has a gate coupled to node N2, a source coupled to receive the Vdd supply voltage, and a drain coupled to constant current source 171. The voltage on the drain of the output transistor 165 is provided to comparator $132_0$ as the analog input voltage Vw.

In the illustrated embodiment, capacitor structures and transistors included in wDAC $130_0$ and qDAC $131_0$ are all high threshold voltage devices fabricated in accordance with MST technology.

In accordance with one embodiment, the capacitor structures 146-150 and 166-170 and 182 are fabricated using capacitors having a structure identical to the storage capacitors included in the DRAM cells of DRAM arrays 800-807. Different capacitor structures include different numbers of capacitors to provide a weighting to the voltages provided by these capacitor structures, when charged. The number of capacitors included in each of the capacitor structures 146-150 and 166-170 and 182 is indicated by a number in parentheses next to the capacitor structure. Thus, capacitor structures 146-150 include 2, 4, 8, 16 and 32 capacitors, respectively, and capacitor structures 166-170 and 182 include 2, 4, 8, 16, 32 and 1 capacitor(s), respectively, wherein multiple capacitors within a capacitor structure are connected in parallel. Note that capacitor structures having the same weights have identical structures. For example, capacitor structures 146 and 166 are identical, and capacitors 148 and 168 are identical. In the above-described manner, the capacitances of capacitor structures 146-150 and 166-170 and 182 are precisely controlled.

Comparator $132_0$ includes pass gate circuits 190 and 191 and differential comparator 1100. Each of the pass gate circuits 190-191 includes an n-channel transistor having a gate coupled to receive a comparator enable signal EN, and a p-channel transistor having a gate coupled to receive a complementary enable signal EN #. When enabled, pass gate circuits 190 and 191 transmit the Vq and Vw voltages, respectively, to comparator circuit 1100. Differential comparator 1100 can be implemented using any one of a plurality of well-known comparator circuits, including, but not limited to, a DRAM sense amplifier circuit, a static random access memory (SRAM) sense amplifier circuit, or an operational amplifier.

The operation of wDAC $130_0$, qDAC $131_0$ and comparator circuit $132_0$ will now be described. Prior to performing a comparison operation, all of the q-data values (i.e., q[127: 0]) and w-data values (i.e., the contents of wLatches $130_1$-$130_{65}$) are isolated from the comparator array $122_1$. In one embodiment, a first plurality of pass gate transistors (not shown) are provided to allow the weight data values w[0:3] in the corresponding wLatch $133_0$ to be selectively provided to (or isolated from) the gates of transistors 160-163, respectively. Similarly, a second plurality of pass gate transistors (not shown) are provided allow the q-data values q[0:3] provided from the DRAM arrays 800-807 to be selectively provided to (or isolated from) the gates of transistors 140-143, respectively. The offset signal OS is initially set to a logic low value. The pre-charge control signal PRE# is activated low, thereby turning on p-channel pre-charge transistors 144 and 164, applying the Vdd supply voltage to nodes N1 and N2. The complementary pre-charge control signal PRE is activated high, thereby turning on n-channel pre-charge transistors 156-159 and 176-180, such that capacitors 146-149, 166-169 and 182 are discharged to ground. Under these conditions, n-channel transistors 140-143, 160-163 and 181 are turned off, thereby isolating the capacitors 146-149 from node N1, and isolating the capacitors 166-169 and 182 from node N2. Capacitors 150 and 170 which are coupled to nodes N1 and N2, respectively, are charged to the full Vdd supply voltage.

At this time, the voltage $V_{N1}$ on node N1 is equal to the voltage $V_{N2}$ on node N2. In response to these equal voltages $V_{N1}$ and $V_{N2}$, the output transistors 145 and 165 provide voltages Vq and Vw, respectively, to pass gate circuits 190 and 191, respectively, wherein each of these voltages Vw and Vq is equal to a pre-charge voltage $V_{PRE}$. Also during this time period, the comparator enable signals EN/EN# are deactivated (i.e., EN=logic low voltage and EN#=logic high voltage), whereby the pass gate circuits 190-191 are turned off, such that the voltages Vq and Vw are not applied to the comparator 1100. However, if the comparator 1100 is implemented using a DRAM sense amplifier, it is understood that the inputs to this DRAM sense amplifier are separately pre-charged to the pre-charge voltage $V_{PRE}$ during this time period, thereby initializing the comparator 1100.

The pre-charge signal PRE# is then deactivated high, thereby turning off p-channel pre-charge transistors 144 and 164. The complementary pre-charge signal PRE is simultaneously deactivated low, thereby turning off n-channel pre-charge transistors 156-159, 166-169 and 182. The offset control voltage OS is then activated high, turning on offset transistor 181. The q-data values q[0:3] and weight data values w[0:3], which have been retrieved in the manner described above, are then applied to transistors 140-143 and 160-163, respectively (e.g., by turning on the first and second plurality of pass gate transistors described above). The q-data bits q[0], q[1], q[2], q[3] having a logic '1' value will turn on the corresponding charging transistors 140, 141, 142, 143, respectively, thereby coupling the corresponding capacitors 146, 147, 148, 149, respectively, to node N1. Similarly, the w-data bits w[0], w[1], w[2], w[3] having a logic '1' value will turn on the corresponding transistors 160, 161, 162, 163, respectively, thereby coupling the corresponding capacitors 166, 167, 168, 169, respectively, to node N2.

The voltage on node N1 is pulled down by any of the capacitors 146-149 coupled to node N1. More specifically, the charge previously stored on capacitor 150 is discharged to any of the capacitors 146-149 that are coupled to node N1 in response to logic high q-data bits q[3:0]. Due to the weight values assigned to capacitors 146-149, these capacitors 146, 147, 148 and 149 pull down the voltage on node N1 by 2, 4, 8 and 16 voltage units, respectively.

The voltage on node N2 is pulled down by offset capacitor 182, and any of the capacitors 146-149 coupled to node N2. More specifically, the charge previously stored on capacitor 170 is discharged to offset capacitor 182 and any of the capacitors 166-169 that are coupled to node N2 in response to logic high weight data bits w[3:0]. Due to the weight values assigned to capacitors 182 and 166-169, these capacitors 182, 166, 167, 168 and 169 pull down the voltage on node N2 by 1, 2, 4, 8 and 16 voltage units, respectively.

The weight of offset capacitor 182 is selected to ensure that the voltage on node N1 ($V_{N1}$) will never equal the voltage on node N2 ($V_{N2}$). If the q-data value q[3:0] is equal to the weight data value w[3:0], the voltage of node N2 will be one (1) voltage unit lower than the voltage of node N1. If the q-data value q[3:0] is less than the weight data value w[3:0], the voltage of node N2 will be lower than the voltage of node N1 (e.g., if q[3:0]='0011' and w[3:0]='0101', the $V_{N2}$ voltage is pulled down by (8)-weight capacitor 168, (2)-weight capacitor 166 and (1)-weight capacitor 182, while the $V_{N1}$ voltage is pulled down by the (4)-weight capacitor 147 and the (2)-weight capacitor 146). If the q-data value q[3:0] is greater than the weight data value w[3:0], the voltage of node N1 will be lower than the voltage of node N2 (e.g., if q[3:0]='1000' and w[3:0]='0111', the $V_{N2}$ voltage is pulled down by (8)-weight capacitor 168, (4)-weight capacitor 167, (2)-weight capacitor 166 and (1)-weight capacitor 182, while the $V_{N1}$ voltage is pulled down by the (16)-weight capacitor 149).

The voltages $V_{N1}$ and $V_{N2}$ are applied to the gates of transistors 145 and 165, respectively. In response, transistors 145 and 165 provide analog voltages Vq and Vw, respectively, to the pass gate circuits 190 and 191, respectively. After the Vq and Vw voltages have been developed, the enable signals EN/EN # are activated, turning on the pass gate circuits 190-191, such that the analog Vq and Vw voltages are applied to the differential comparator 1100. If the q-data value q[3:0] is greater than the weight data value w[3:0], then the $V_{N1}$ voltage will be less than the $V_{N2}$ voltage, such that the Vq voltage will be less than the Vw voltage. Under these conditions, the differential comparator 1100 latches a logic high voltage (Vdd), which is provided as the comparator output, out[0]. In accordance with one embodiment, a 'match' condition is specified when the q-data value q[3:0] is greater than the weight data value w[3:0].

If the q-data value q[3:0] is not greater than the weight data value w[3:0], then the $V_{N1}$ voltage will be greater than the $V_{N2}$ voltage, such that the Vq voltage will be greater than the Vw voltage. Under these conditions, the differential comparator 1100 latches a logic low voltage (ground), which is provided as the comparator output, out[0].

The differential comparator 1100 is designed to latch in response to a voltage difference corresponding with a (1)-weight capacitor voltage or more. In one embodiment, the transistors used to fabricate the differential comparator 1100 are low threshold voltage transistors fabricated using MST technology to enable this comparator to reliably latch in this manner.

In the above-described manner wDAC 130₀ and qDAC 131₀ simply act as digital-to-analog converters (DACs) for the 4-bit input data values w[3:0] and q[3:0] to create 16 possible resulting analog values to be stored on the capacitors 150 and 170 (i.e., nodes N1 and N2). The wDAC 130₀ includes the additional offset capacitor 182, which is half the size of the least significant bit capacitor 166, in order to greatly reduce the possibility of metastability if the w[3:0] and q[3:0] values are the same. The analog voltages on nodes N1 and N2 are transferred to the comparator 132₀ and the resulting comparison output (e.g., out[0]) is buffered and sent to the comparator output TSVs 121₁. This mimics the action of neurons in the brain far more efficiently than the transistor neuron structures found in the typical machine learning implementations.

Current silicon implementations that roughly match the power of the 20 Watt human brain use many orders of magnitude more power and huge numbers of chips. Power being the critical limitation, the advantage of the structure of the present invention, when being used in an artificial intelligence (AI) application, is that the default condition of the comparator output is "no match", as in the brain. The only time power needs to be used to drive the TSV outputs 121₁ is when there is a match, which is rarely, as in the brain.

As described above, the processor 700 of the control/ interface ASIC 102 causes data to be retrieved from the DRAM arrays 800 and 804 of the DRAM chip 501 and loaded into the qDACs $131_0$-$131_{63}$ for comparison with incoming weight data that is loaded into the wDACs $130_0$- $130_{98}$ by the processor 700. In one example implementation, the stored weight data loaded into the wDACs $130_0$-$130_{98}$ may be image data, and the data loaded into the qDACs $131_0$-$131_{63}$ may be data associated with a video feed that is being searched for object (e.g., facial) recognition. The comparator circuits $132_0$-$132_{255}$ indicate when a match occurs for each set of 4-bit values based upon a comparison of the voltage levels from the wDACs 130 and qDACs 131, as will be appreciated by those skilled in the art. In the embodiments described herein, the actual processing of the full set of comparator outputs provided on TSVs $121_1$ is accomplished on the control/interface ASIC chip 102.

In the above-described embodiment, data granularity is 64 or 128 bits. Further granularity may be achieved at the control/interface ASIC 102 level. It is noted that data coming from the DRAM arrays 800-807 may be broadcast to both a standard output data path $124_1$-$124_4$ and to the comparator arrays $122_1$-$122_4$. Selection/deselection may occur at the input of each path, and the comparator data output path $121_1$-$121_4$ may be enabled at the same time as the standard data output path $124_1$-$124_4$, if desired. It should also be noted that the sizes of the comparator arrays $122_1$-$122_4$ are flexible and may be adjusted for different applications.

By way of comparison, typical machine learning configurations use SRAM bit lines as comparator inputs. However, significant non-linearities in bit line/bit cell systems may limit resolution to 3 bits ($2^3$=8 distinct levels) that can be discerned. However, the above-described configurations advantageously allow for 4 bits ($2^4$=16 distinct levels) easily, particularly with the use of MST devices in the comparator input stage, for example. It should also be noted that, while the comparator arrays $122_1$-$122_4$ are described above with reference to a DRAM implementation (i.e., in connection with q-data inputs received from DRAM arrays 800-807), this comparator array may be used in other circuit configurations as well, such as logic chips or FLASH memory implementations, for example.

Although the invention has been described in connection with several embodiments, it is understood that this invention is not limited to the embodiments disclosed, but is capable of various modifications, which would be apparent to a person skilled in the art. Accordingly, the present invention is limited only by the following claims.

I claim:
1. A memory system comprising:
a first integrated circuit chip comprising a first processor;
a second integrated circuit chip comprising a first dynamic random access memory (DRAM) sector including:
a first plurality of DRAM arrays;
a first output circuit configured to store a first plurality of data values read from the first plurality of DRAM arrays;
a first set of through silicon vias connecting the first processor to the first DRAM sector, wherein the first processor transmits a first plurality of weight data values to the first DRAM sector on the first set of through silicon vias;
a first plurality of comparator arrays coupled to receive the first plurality of weight data values and the first plurality of data values read from the first plurality of DRAM arrays, and in response, generate a first plurality of comparison output values; and
a second set of through silicon vias connecting the first processor to the first DRAM sector, wherein the first plurality of comparison output values are transmitted from the first DRAM sector to the first processor on the second set of through silicon vias.
2. The memory system of claim 1, further comprising a third set of through silicon vias connecting the first processor to the first DRAM sector, wherein the first processor transmits addresses for reading the first plurality of data values from the first plurality of DRAM arrays on the third set of through silicon vias.
3. The memory system of claim 1, wherein the first integrated circuit chip further comprises a second processor and an interconnect structure that couples the first processor to the second processor, and wherein the second integrated circuit chip further comprises:
a second dynamic random access memory (DRAM) sector including:
a second plurality of DRAM arrays;
a second output circuit configured to store a second plurality of data values read from the second plurality of DRAM arrays;
a third set of through silicon vias connecting the second processor to the second DRAM sector, wherein the second processor transmits a second plurality of weight data values to the second DRAM sector on the third set of through silicon vias;
a second plurality of comparator arrays coupled to receive the second plurality of weight data values and the second plurality of data values read from the second plurality of DRAM arrays, and in response, generate a second plurality of comparison output values; and
a fourth set of through silicon vias connecting the second processor to the second DRAM sector, wherein the second plurality of comparison output values are transmitted from second DRAM sector to the second processor on the fourth set of through silicon vias.
4. The memory system of claim 3, wherein the first DRAM sector does not communicate with the second DRAM sector on the second integrated circuit chip.
5. The memory system of claim 1, further comprising a third integrated circuit chip comprising:
a second dynamic random access memory (DRAM) sector including:
a second plurality of DRAM arrays;
a second output circuit configured to store a second plurality of data values read from the second plurality of DRAM arrays;
a third set of through silicon vias connecting the first processor to the second DRAM sector, wherein the first processor transmits a second plurality of weight data values to the second DRAM sector on the third set of through silicon vias;
a second plurality of comparator arrays coupled to receive the second plurality of weight data values and the second plurality of data values read from the second plurality of DRAM arrays, and in response, generate a second plurality of comparison output values; and
a fourth set of through silicon vias connecting the first processor to the second DRAM sector, wherein the second plurality of comparison output values are transmitted from second DRAM sector to the first processor on the fourth set of through silicon vias.

6. The memory system of claim 1, further comprising a third integrated circuit chip coupled to the first and second integrated circuit chips by a third set of through silicon vias, wherein the third integrated circuit chip provides a plurality of supply voltages to the first and second integrated circuit chips on the third set of through silicon vias.

7. The memory system of claim 1, wherein the first plurality of comparator arrays comprises:

a first digital-to-analog converter configured to receive a multi-bit weight data value from the first plurality of weight data values, and in response, provide a first analog output signal;

a second digital-to-analog converter configured to receive a multi-bit data value from the first plurality of data values read from the first plurality of DRAM arrays, and in response, generate a second analog output signal;

a comparator circuit configured to receive the first and second analog output signals, and in response, provide one of the first plurality of comparison output values.

8. The memory system of claim 7, wherein the first digital-to-analog converter comprises:

a first capacitor structure directly connected to a first node;

a first plurality of capacitor structures; and a first plurality of transistors, wherein each of the first plurality of capacitor structures is coupled to the first node by a corresponding one of the first plurality of transistors, and wherein each of the first plurality of transistors has a gate coupled to receive a corresponding bit of the multi-bit weight data value.

9. The memory system of claim 8, wherein the first capacitor structure and the first plurality of capacitor structures each comprise a different number of identical capacitors.

10. The memory system of claim 9, wherein the first digital-to-analog converter further comprises:

an offset capacitor structure; and an offset transistor coupling the offset capacitor structure to the first node, wherein the offset transistor has a gate coupled to receive an offset control signal.

11. The memory system of claim 8, wherein the second digital-to-analog converter comprises:

a second capacitor structure directly connected to a second node, wherein the second capacitor structure is identical to the first capacitor structure;

a second plurality of capacitor structures, wherein the second plurality of capacitor structures is identical to the first plurality of capacitor structures; and a second plurality of transistors, wherein each of the second plurality of capacitor structures is coupled to the second node by a corresponding one of the second plurality of transistors, and wherein each of the second plurality of transistors has a gate coupled to receive a corresponding bit of the multi-bit data value.

12. The memory system of claim 11, wherein the first digital-to-analog converter includes a first output circuit that generates the first analog output signal in response to a voltage on the first node, and wherein the second digital-to-analog converter includes a second output circuit that generates the second analog output signal in response to a voltage on the second node.

13. The memory system of claim 12, wherein the comparator circuit comprises a differential comparator that latches the one of the first plurality of comparison output values in response to the first and second analog output signals.

14. The memory system of claim 7, wherein the comparator circuit only activates the one of the first plurality of comparison output values to a logic high voltage state when the multi-bit data value is greater than the multi-bit weight data value.

15. The memory system of claim 1, wherein the first plurality of comparator arrays comprises: a plurality of latches for storing the plurality of weight data values, wherein the plurality of weight data values are sequentially loaded into the plurality of latches.

16. The memory system of claim 1, wherein the plurality of comparator arrays comprises:

a plurality of columns of q-data digital-to-analog converters, wherein each of the q-data digital-to-analog converters is coupled to receive a corresponding plurality of bits of the first plurality of data values;

a plurality of columns of weight data digital-to-analog converters, wherein each of the weight data digital-to-analog converters is coupled to receive a corresponding plurality of bits of the plurality of weight data values; and a plurality of columns of comparator circuits, wherein each of the columns of comparator circuits is located between one of the columns of q-data digital-to-analog converters, and one of the columns of weight data digital-to-analog converters.

17. A method comprising transmitting a first comparison instruction and a corresponding first plurality of weight data values from a first processor on a first integrated circuit chip to a first dynamic random access memory (DRAM) sector on a second integrated circuit chip, wherein the first DRAM sector comprises a first plurality of DRAM arrays;

reading a first plurality of data values from the first plurality of DRAM arrays in response to the first comparison instruction;

generating a first plurality of comparison output values in response to the first plurality of data values and the first plurality of weight data values; and transmitting the first plurality of comparison output values from the first DRAM sector to the first processor.

18. The method of claim 17, further comprising:

transmitting the first comparison instruction and the first plurality of weight data values on a first set of through silicon vias connecting the first processor to the first DRAM sector; and transmitting the first plurality of comparison output values on a second set of through silicon vias connecting the first processor to the first DRAM sector.

19. The method of claim 17, further comprising:

generating a first analog output signal in response to a multi-bit weight data value included in the first plurality of weight data values;

generating a second analog output signal in response to a multi-bit data value included in the first plurality of data values read from the first plurality of DRAM arrays; and generating one of the first plurality of comparison output values in response to the first and second analog output signals.

20. The method of claim 17, further comprising:

transmitting a second comparison instruction and a corresponding second plurality of weight data values from a second processor on a first integrated circuit chip to a second dynamic random access memory (DRAM) sector on the second integrated circuit chip, wherein the second DRAM sector comprises a second plurality of DRAM arrays;

reading a second plurality of data values from the second plurality of DRAM arrays in response to the second comparison instruction;

generating a second plurality of comparison output values in response to the second plurality of data values and the second plurality of weight data values; and transmitting the second plurality of comparison output values from the second DRAM sector to the second processor.

\* \* \* \* \*